(12) United States Patent
Frougier et al.

(10) Patent No.: US 10,192,867 B1
(45) Date of Patent: Jan. 29, 2019

(54) COMPLEMENTARY FETS WITH WRAP AROUND CONTACTS AND METHOD OF FORMING SAME

(71) Applicant: GLOBALFOUNDRIES INC., Grand Cayman (KY)

(72) Inventors: Julien Frougier, Albany, NY (US); Ruilong Xie, Schenectady, NY (US); Puneet H. Suvarna, Menands, NY (US); Hiroaki Niimi, Cohoes, NY (US); Steven J. Bentley, Menands, NY (US); Ali Razavieh, Albany, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/888,401

(22) Filed: Feb. 5, 2018

(51) Int. Cl.
| | |
|---|---|
| *H01L 21/02* | (2006.01) |
| *H01L 29/66* | (2006.01) |
| *H01L 27/092* | (2006.01) |
| *H01L 29/786* | (2006.01) |
| *H01L 29/45* | (2006.01) |
| *H01L 21/8238* | (2006.01) |
| *H01L 21/768* | (2006.01) |
| *H01L 21/285* | (2006.01) |

(52) U.S. Cl.
CPC ...... *H01L 27/092* (2013.01); *H01L 21/28518* (2013.01); *H01L 21/76877* (2013.01); *H01L 21/823864* (2013.01); *H01L 21/823871* (2013.01); *H01L 29/458* (2013.01); *H01L 29/66545* (2013.01); *H01L 29/78696* (2013.01)

(58) Field of Classification Search
CPC ... H01L 29/0673; H01L 29/16; H01L 29/165; H01L 21/02532; H01L 29/0847; H01L 29/7848; H01L 29/66795; H01L 29/785; H01L 29/42392; H01L 29/66439; H01L 29/775; H01L 9/0653; H01L 29/0665; H01L 29/1037; B82Y 10/00; B82Y 40/00
See application file for complete search history.

(56) References Cited

U.S. PATENT DOCUMENTS

| 6,744,087 | B2 * | 6/2004 | Misewich | G11C 11/22 |
| | | | | 257/295 |
| 7,892,956 | B2 * | 2/2011 | Deligianni | B82Y 10/00 |
| | | | | 257/E29.262 |
| 9,653,289 | B1 * | 5/2017 | Balakrishnan | H01L 27/088 |
| 9,748,335 | B1 * | 8/2017 | Bentley | H01L 29/0673 |
| 9,773,913 | B1 * | 9/2017 | Balakrishnan | H01L 29/78618 |
| 9,941,405 | B2 * | 4/2018 | Kittl | H01L 29/7848 |
| 10,014,390 | B1 * | 7/2018 | Bouche | H01L 29/66553 |
| 2011/0012085 | A1 * | 1/2011 | Deligianni | B82Y 10/00 |
| | | | | 257/9 |

(Continued)

*Primary Examiner* — Savitr Mulpuri
(74) *Attorney, Agent, or Firm* — Yuanmin Cai; Hoffman Warnick LLC

(57) ABSTRACT

The present disclosure relates generally to wrap around contact formation in source/drain regions of a semiconductor device such as an integrated circuit (IC), and more particularly, to stacked IC structures containing complementary FETs (CFETs) having wrap around contacts and methods of forming the same. Disclosed is a stacked IC structure including a first FET on a substrate, a second FET vertically stacked above the first FET, a dielectric layer above the second FET, and a spacer layer between FETs, wherein each FET has an electrically isolated wrap-around contact formed therearound.

6 Claims, 34 Drawing Sheets

(56) References Cited

U.S. PATENT DOCUMENTS

2014/0084387 A1    3/2014  Dewey et al.
2016/0111513 A1    4/2016  Liu et al.
2016/0163796 A1    6/2016  Obradovic et al.
2017/0271474 A1*   9/2017  Obradovic ............ H01L 27/088
2018/0006118 A1*   1/2018  Mallela ................. H01L 27/088
2018/0053830 A1*   2/2018  Cheng ................. H01L 29/6656

* cited by examiner

US 10,192,867 B1

COMPLEMENTARY FETS WITH WRAP AROUND CONTACTS AND METHOD OF FORMING SAME

TECHNICAL FIELD

The subject matter disclosed herein relates generally to wrap around contact formation in source/drain regions of a semiconductor device such as an integrated circuit (IC), and more particularly, to stacked IC structures containing complementary FETs (CFETs) having wrap around contacts and methods of forming the same.

BACKGROUND

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a complementary FET (CFET) where nFET and pFET nanowires/nanosheets are vertically stacked on top of each other. However, one of the processing complexities of CFETs that needs to be addressed at nodes beyond 7 nm is independently growing the nFET and pFET source/drain Epitaxy while maintaining vertical integration and electrical disconnection. Using a conventional nanowire/nanosheet source/drain Epitaxy process for CFETs would form superposed n-doped Epitaxy and p-doped Epitaxy, making it challenging to form independent n- and p-contacts and especially difficult for wrap-around contacts. Thus, a method of forming CFETs with wrap around contacts that maintain vertical integration and electrical disconnection of the nFET and pFET source/drain Epitaxy is needed.

Furthermore, optimizing source/drain contact resistance remains a critical aspect to successful technology scaling. In the instance of complementary metal-oxide-semiconductor (CMOS) technology, access resistance is limited by contact resistance which is strongly dependent on the contact area. Therefore, a contact that wraps around the source/drain Epitaxy is desirable since it provides a way to increase the effective contact area while preserving aggressively scaled contacted poly pitch (CPP; also known as transistor gate pitch).

BRIEF SUMMARY

Stacked IC structures containing complementary FETs (CFETs) having wrap around contacts and methods of forming the same are disclosed. In a first aspect of the disclosure, a stacked IC structure includes: a first FET on a substrate, the first FET including at least one first gate, at least one first source and at least one first drain; a second FET vertically stacked above the first FET, the second FET including at least one second gate, at least one second source and at least one second drain, the first and second gates being vertically aligned, and at least a portion of the second source and at least a portion of the second drain are above and vertically aligned with at least a portion of the first source and at least a portion of the first drain, respectively; a dielectric layer above the second FET; a spacer layer between each of the vertically stacked first and second sources and first and second drains; a first lateral conductive metal region that surrounds at least one of the first source and the first drain of the first FET and extends laterally outward beyond any portion of the second FET thereabove; a first vertical conductive metal region that extends upward from the first lateral conductive metal region to a top surface of the dielectric layer; and a second vertical conductive metal region that surrounds at least one of the second source and the second drain of the second FET and extends upward to the top surface of the dielectric layer, the second vertical conductive metal region not intersecting the first vertical conductive metal region.

In a second aspect of the disclosure, a method of forming a stacked IC structure includes: forming a first FET on a substrate, the first FET including at least one first gate, at least one first source and at least one first drain; forming a spacer layer over the first source and the first drain of the first FET; forming a second FET over the spacer layer, the second FET being vertically stacked above the first FET, the second FET including at least one second gate, at least one second source and at least one second drain, the first and second gates being vertically aligned, and at least a portion of the second source and at least a portion of the second drain being above and vertically aligned with at least a portion of the first source and at least a portion of the first drain, respectively; forming a dielectric layer over the second FET; forming a first lateral conductive metal region and a first vertical conductive metal region, the first lateral conductive metal region surrounding at least one of the first source and the first drain of the first FET and extending laterally outward beyond any portion of the second FET thereabove, the first vertical conductive metal region extending upwards from the first lateral conductive metal region to a top surface of the dielectric layer; and forming a second vertical conductive metal region, the second vertical conductive metal region surrounding at least one of the second source and the second drain of the second FET and extending upwards to the top surface of the dielectric layer, the second vertical conductive metal region not intersecting the first vertical conductive metal region.

In a third aspect of the disclosure, another method of forming a stacked IC structure includes: forming a first FET on a substrate, the first FET including at least one first gate, at least one first source and at least one first drain; forming an isolation layer and a spacer layer, in that order, over the first source and first drain of the first FET; forming a second FET over the spacer layer, the second FET being vertically stacked above the first FET, the second FET including at least one second gate, at least one second source and at least one second drain, the first and second gates being vertically aligned, and at least a portion of the second source and at least a portion of the second drain being above and vertically aligned with at least a portion of the first source and at least a portion of the first drain, respectively; forming a wrap-around contact around at least one of the first source and the first drain of the first FET and around at least one of the second source and the second drain of the second FET; and forming a first isolation pillar and a second isolation pillar within the wrap-around contact such that the wrapped-around first source/drain is electrically isolated from the wrapped-around second source/drain.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 18 depicts a first different epitaxy growth on the first epitaxy growth, which is immediately preceded by the method steps depicted in FIGS. 2-4.

Figure 1:
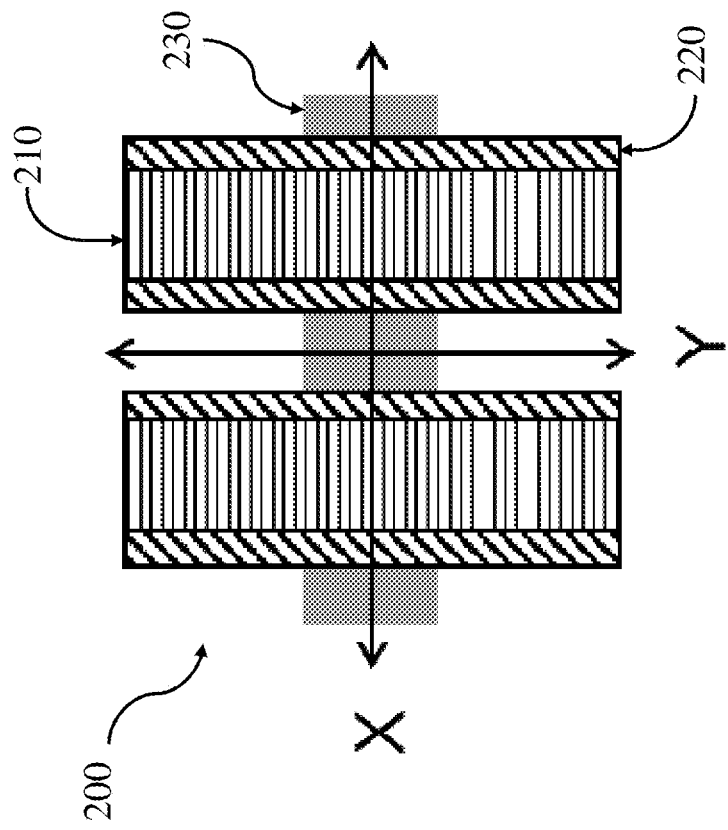
FIG. 1 depicts a plan view of a partial FET structure indicating an X cross-section location and a Y cross-section location for each of the following figures.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. The subject matter of this disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

In the interest of not obscuring the presentation of embodiments of the present disclosure, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present disclosure.

The present disclosure relates generally to wrap around contact formation in source/drain regions of a semiconductor device such as an integrated circuit (IC), and more particularly, to stacked IC structures containing complementary FETs (CFETs) having wrap around contacts and methods of forming the same. As mentioned above, advancement to nodes beyond 7 nm using CFETs suffers from the need for a process which can independently grow the nFET and pFET source/drain Epitaxy while maintaining vertical integration and electrical disconnection. Methods of forming CFETs with wrap around contacts for use in a semiconductor device that maintains vertical integration and electrical disconnection of the nFET and pFET source/drain Epitaxy are described below and with reference to the Figures. In addition, methods of forming CFETs with wrap around contacts for use in a semiconductor device that have improved source/drain contact resistance while preserving aggressively scaled CPP are described below and with reference to the Figures.

FIG. 1 illustrates a partial FET structure 200 (in plan view) indicating an X-cross section location and a Y cross-section location for identification purposes for each of the following figures. Partial FET structure 200 includes a gate 210 flanked by gate spacers 220 on top of a nanosheet stack 230. The X-cross section is an across-the-gate cross-section whereas the Y-cross section is an across-the-nanosheet stack cross-section that is perpendicular to the X-cross section and is between the gates.

Turning to a first embodiment of the structures of the disclosure, FIG. 2 through FIG. 17 will be discussed.

Figure 2:
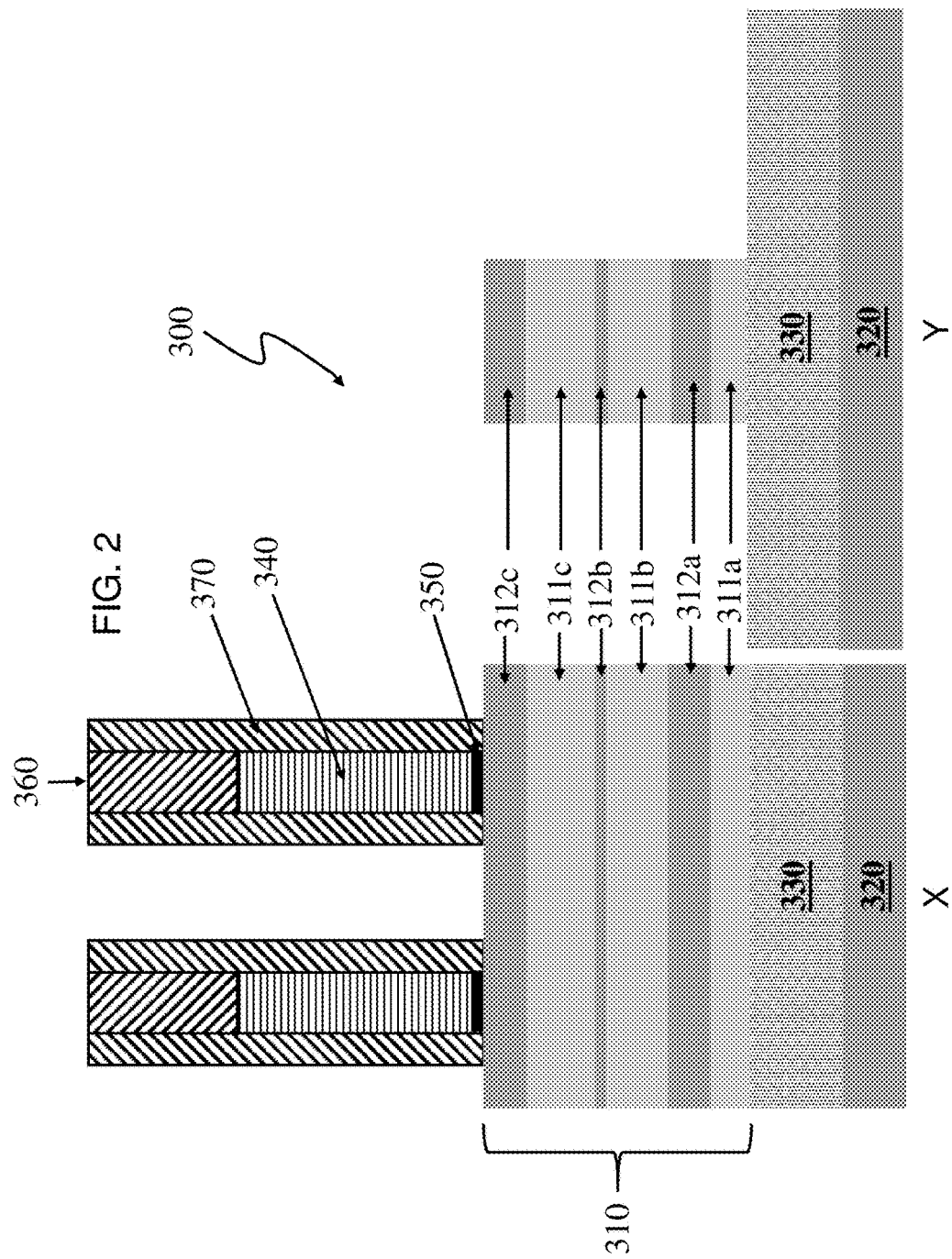
FIG. 2 depicts a preliminary structure used for forming the first and second FETs of the structures of the disclosure, the preliminary structure including (in part) dummy gates on a nanosheet stack.

FIG. 2 illustrates a preliminary structure 300 used for forming the structures of the disclosure. Preliminary structure 300 is the result of epitaxially growing a nanosheet stack 310 of alternating layers of silicon-germanium (SiGe) 311 and silicon (Si) 312 on a substrate 320. However, different variations from that depicted in FIG. 2 can be used for the stacking of the Si and SiGe layers. The terms "epitaxial growth" and "epitaxially forming and/or growing" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

Nanosheet stack 310 includes a bottom-most layer of SiGe 311a and a top-most layer of Si 312c. Nanosheet stack 310 is depicted with six layers (three SiGe layers and three Si layers), however any number and combination of layers can be used so long as the layers alternate between SiGe and Si. Nanosheet stack 310 is depicted with the layers being in the form of nanosheets, however the width of any given nanosheet layer can be varied so as to result in the form of a nanowire, a nanoellipse, a nanorod, etc. SiGe layers 311 can be composed of, for instance, $SiGe_{20-60}$, examples thereof including, but not limited to $SiGe_{20}$, $SiGe_{25}$, $SiGe_{30}$ . . . $SiGe_{60}$. Substrate 320 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). An insulating layer 330 may be present on substrate 320 and, if present, is located between substrate 320 and nanosheet stack 310. Insulating layer 330 can be, for example, a buried oxide layer (typically $SiO_2$) or a bottom dielectric isolation layer formed early in the process (typically SiN, SiBCN, SiOCN, SiOC, or any combination of low-k materials).

Preliminary structure 300 also depicts the result of forming at least one dummy gate 340 on nanosheet stack 310. Two dummy gates 340 are shown however any number of gates 340 can be formed. Dummy gates 340 can be formed by depositing a dummy gate material over top portions of top-most layer 312c of nanosheet stack 310. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material can be, for example, polycrystalline silicon, amorphous silicon or microcrystal silicon. A protective layer, for example a dummy oxide layer 350 may be present between dummy gate 340 and nanosheet stack 310.

Dummy gate 340 is protected by a hardmask 360 formed on a top surface thereof. Dummy gate 340 is also protected by gate spacers 370 formed on sidewalls thereof. Gate spacers 370 can extend upward along sidewalls of hardmask 360 as well. Hardmask 360 and gate spacers 370 may be the same material or may be different materials and may be comprised of any one or more of a variety of different insulative materials, such as $Si_3N_4$, SiBCN, SiNC, SiN, SiCO, $SiO_2$, SiNOC, etc.

Figure 3:
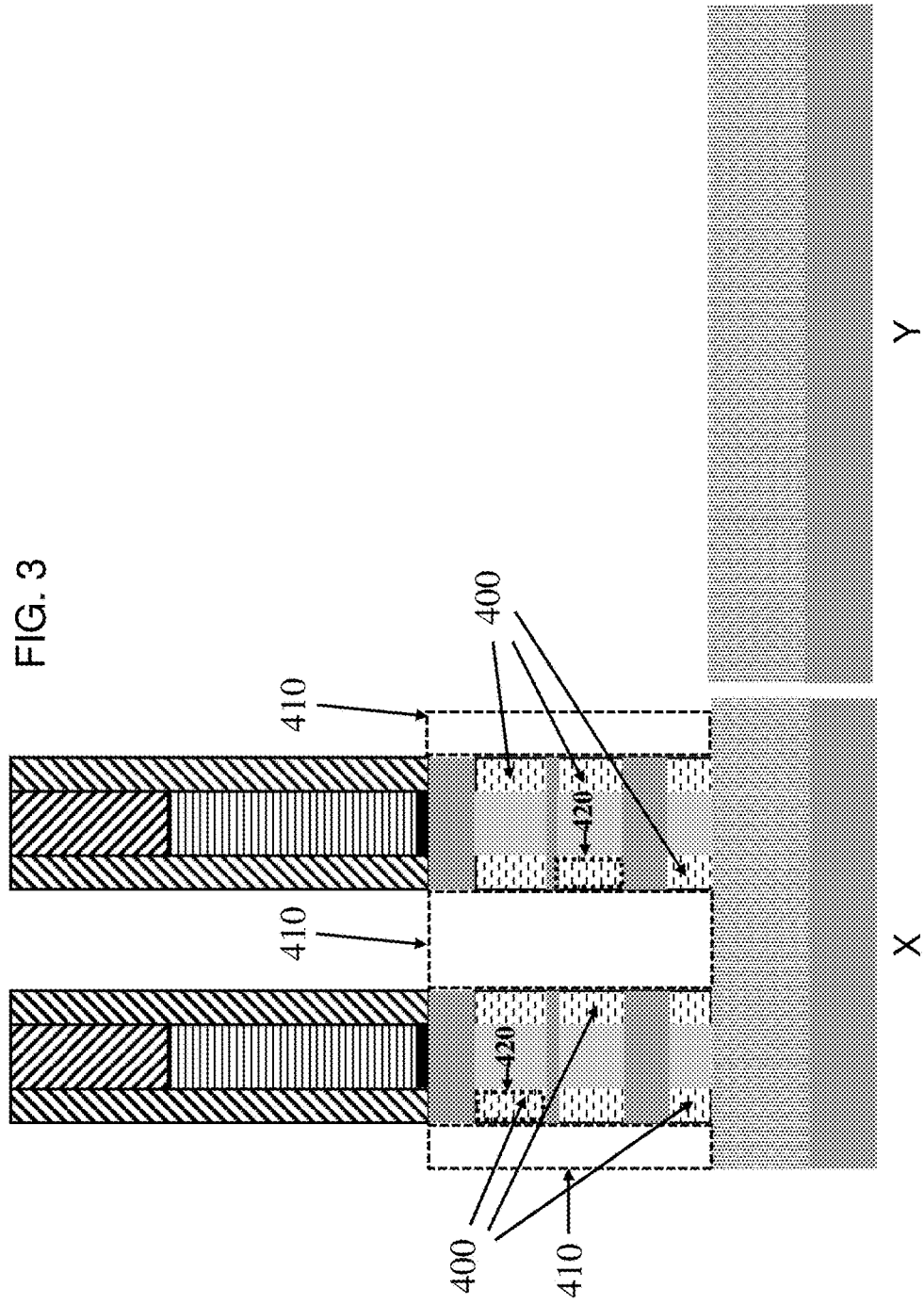
FIG. 3 depicts specific and selective etching of the nanosheet stack layers and formation of inner spacers.

FIG. 3 illustrates etching of nanosheet stack 310 and formation of inner spacers 400. More specifically, first is performed etching of nanosheet stack layers 311, 312 such that portions 410 which are not underneath gate spacers 370 and not underneath dummy gate 340 are removed. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

After generally etching nanosheet stack 310, next is performed a selective etching of SiGe layers 311 of nanosheet stack 310 such that portions 420 which are \underneath gate spacers 370 are removed. Inner spacers 400 are then formed in etched portions 420 and thus are located under gate spacers 370. Inner spacers 400 can be composed of any suitable dielectric material, for example $Si_3N_4$, SiBCN, SiNC, SiN, SiCO, $SiO_2$, SiNOC, etc.

Figure 4:
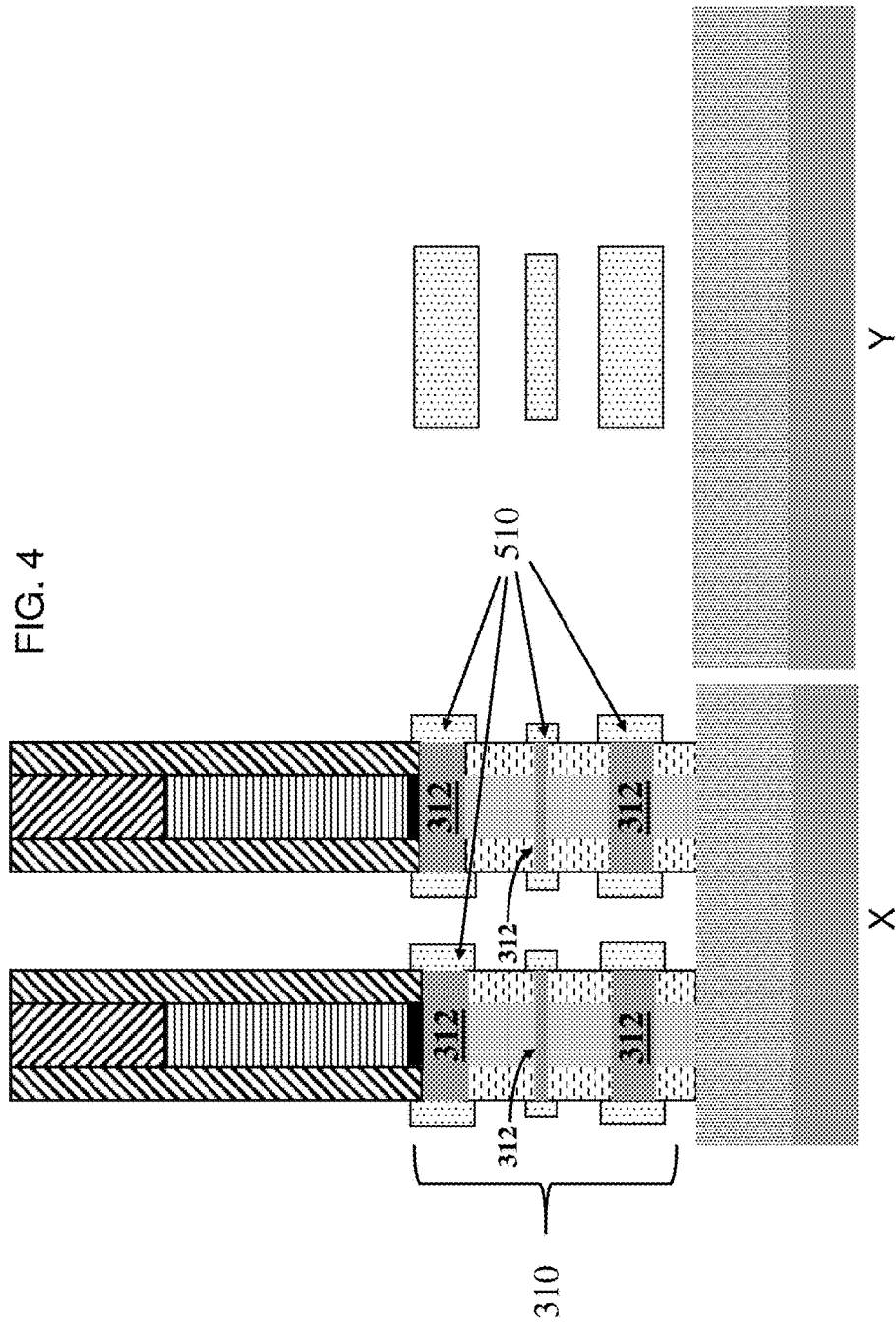
FIG. 4 depicts a first epitaxy growth on nanosheet stack layer edges.

FIG. 4 illustrates epitaxial growth of a first doped material 510 on vertical edges of Si layers 312 of nanosheet stack 310. Doping is the process of introducing impurities (dopants) into a substrate. For example, doped Epitaxy is used to form the source and drain regions of a FET. Forming a doped Epitaxy can include introducing dopants in gas phase in a chamber during Epitaxy growth such that the dopants are progressively incorporated during the growth process. Dopants are of two types: "donors" (or n-type) and "acceptors" (or p-type). Common dopants in silicon (or silicon-based materials) for p-type are boron (B) and indium (In), and for n-type are phosphorous (P), arsenic (As) and antimony (Sb). If a bottom-most FET of a CFET is desired to be an nFET, then first doped material 510 would be n-doped, for instance Si:P. However, if a bottom-most FET of a CFET is desired to be a pFET, then first doped material 510 would be p-doped, for instance Si:B or SiGe:B.

Figure 5:
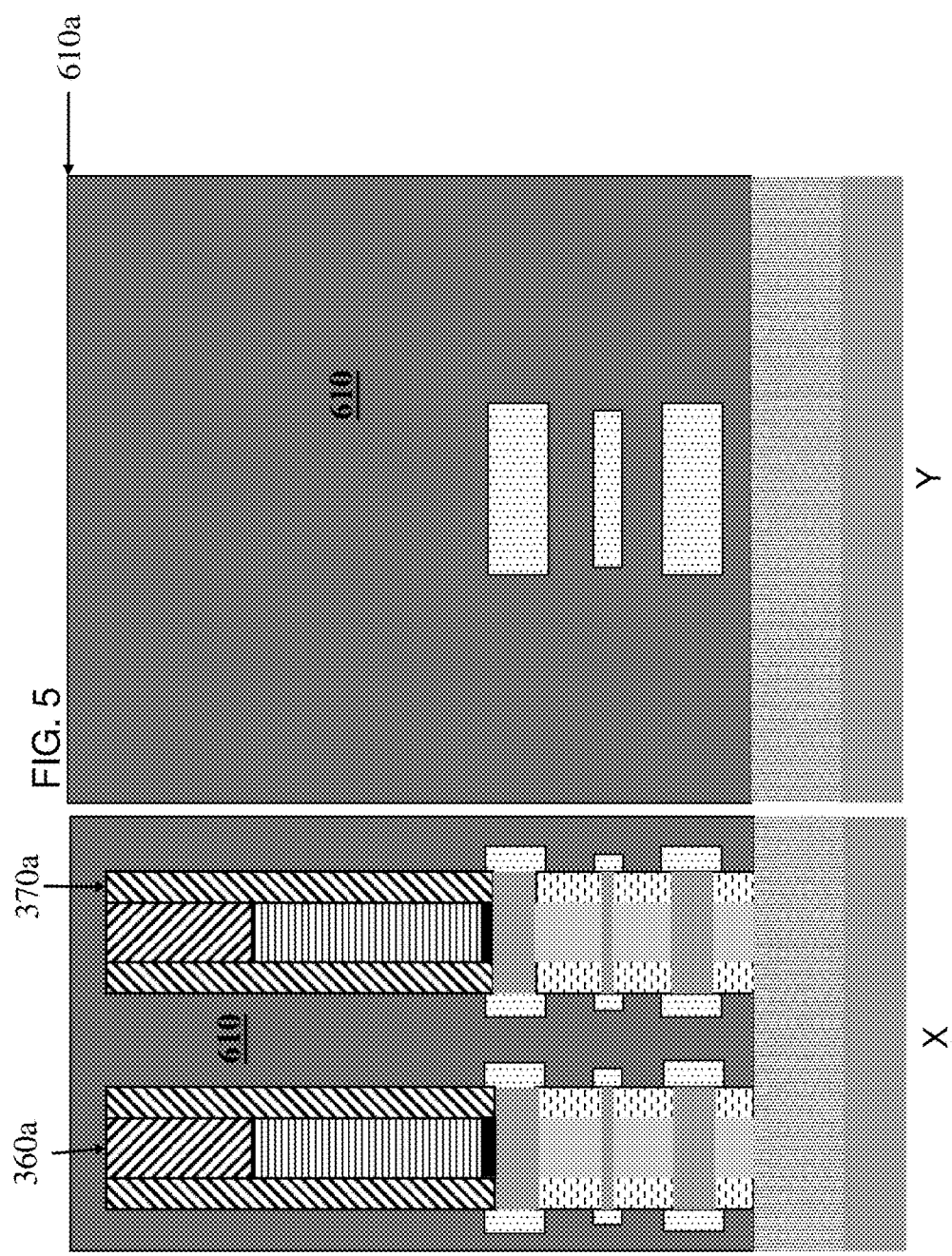
FIG. 5 depicts encapsulation and overfilling of the structure.

FIG. 5 illustrates encapsulation of first doped material 510 with a first sacrificial SiGe material 610. First SiGe material 610 has a lower percentage of Ge than SiGe layers 311 of nanosheet stack 310. First SiGe material 610 can be, for instance, $SiGe_{25}$ when SiGe layers 311 are, for instance, $SiGe_{30-60}$ (as noted above). The noted encapsulation can be performed, for example, by epitaxially growing first SiGe material 610 on surfaces of first doped material 510. FIG. 5 also illustrates overfilling with first SiGe material 610 such that a top surface 610a of first SiGe material 610 is above a top surface 370a of gate spacers 370 and a top surface 360a of hardmask 360. The noted overfilling can be performed by any above-discussed depositing technique including, for example, plasma-enhanced chemical vapor deposition (PECVD).

Figure 6:
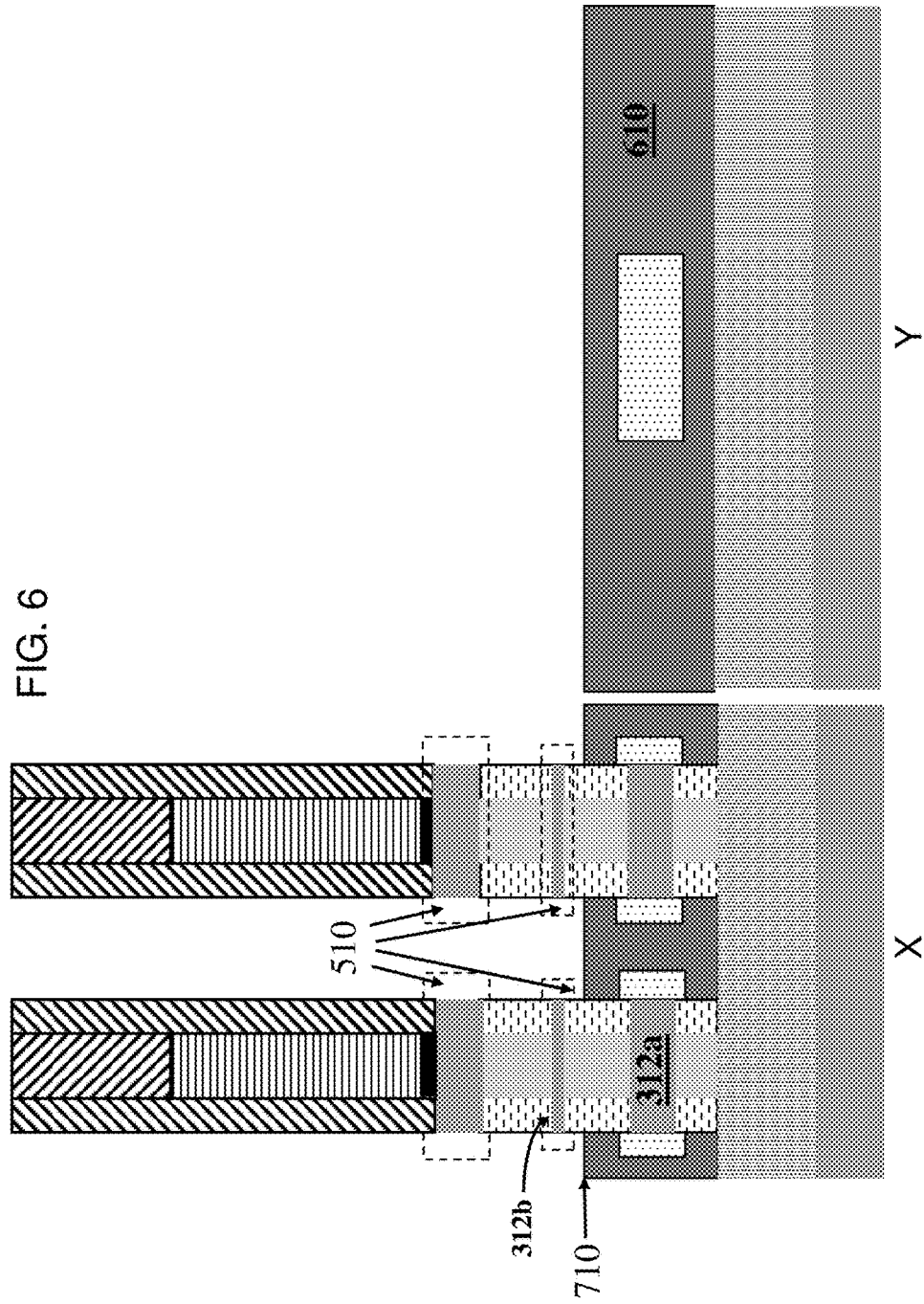
FIG. 6 depicts etch-back and planarizing of the overfill.

FIG. 6 illustrates etching of first SiGe material 610 and first doped material 510. The etching is performed such that all of first SiGe material 610 and all of first doped material 510 above a certain level 710 is removed. Level 710 is vertically located between any two Si layers 312. In the instance of FIG. 6, level 710 is located between Si layer 312a and Si layer 312b.

Figure 7:
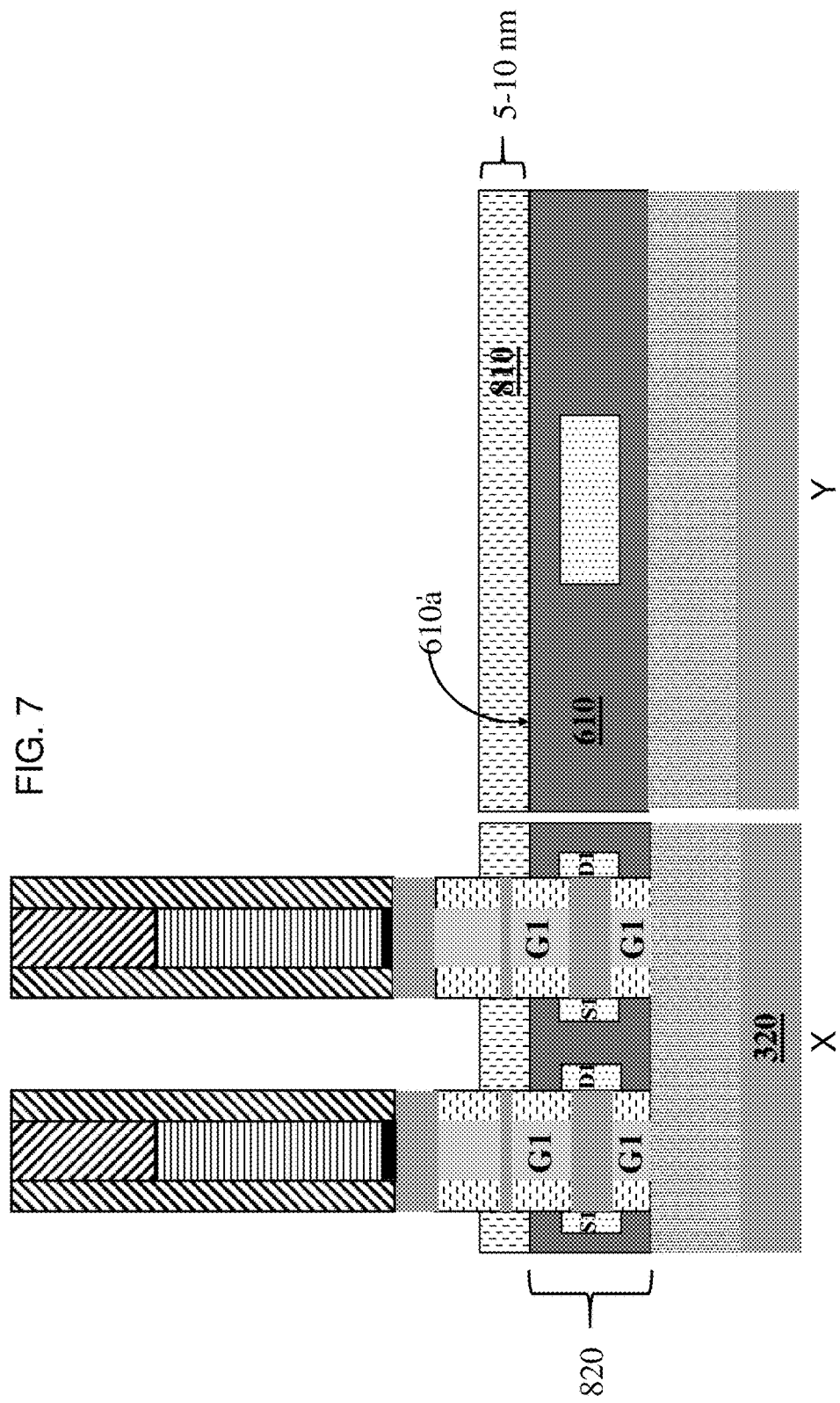
FIG. 7 depicts source/drain Epitaxy spacer layer formation.

FIG. 7 illustrates forming a spacer layer 810 on a top surface 610a' of etched first SiGe material 610. Spacer layer 810 is preferably 5 to 10 nanometers thick. Spacer layer 810 provides electrical disconnection of source/drain region(s) of a first (bottom) FET from source/drain region(s) of a second (upper) FET (first and second FETs being discussed below). Spacer layer 810 may be deposited by any above-discussed depositing technique including, for example, gas cluster ion beam (GCIB) deposition or deposition/etch cycles using anisotropic high-density plasma (HDP) deposition combined with isotropic etch back.

The summation of the processing as shown in FIG. 2 through FIG. 7 produces a first FET structure 820 having spacer layer 810 thereon. First FET structure 820 has at least one first gate region (G1) (filled with sacrificial SiGe at this stage), at least one first source (S1) and at least one first drain (D1) (see FIG. 7). For illustration purposes only, FIG. 7 depicts two first gate regions G1, two first sources S1 and two first drains D1. Any number of gate region/source/drain combinations can be used.

Figure 8:
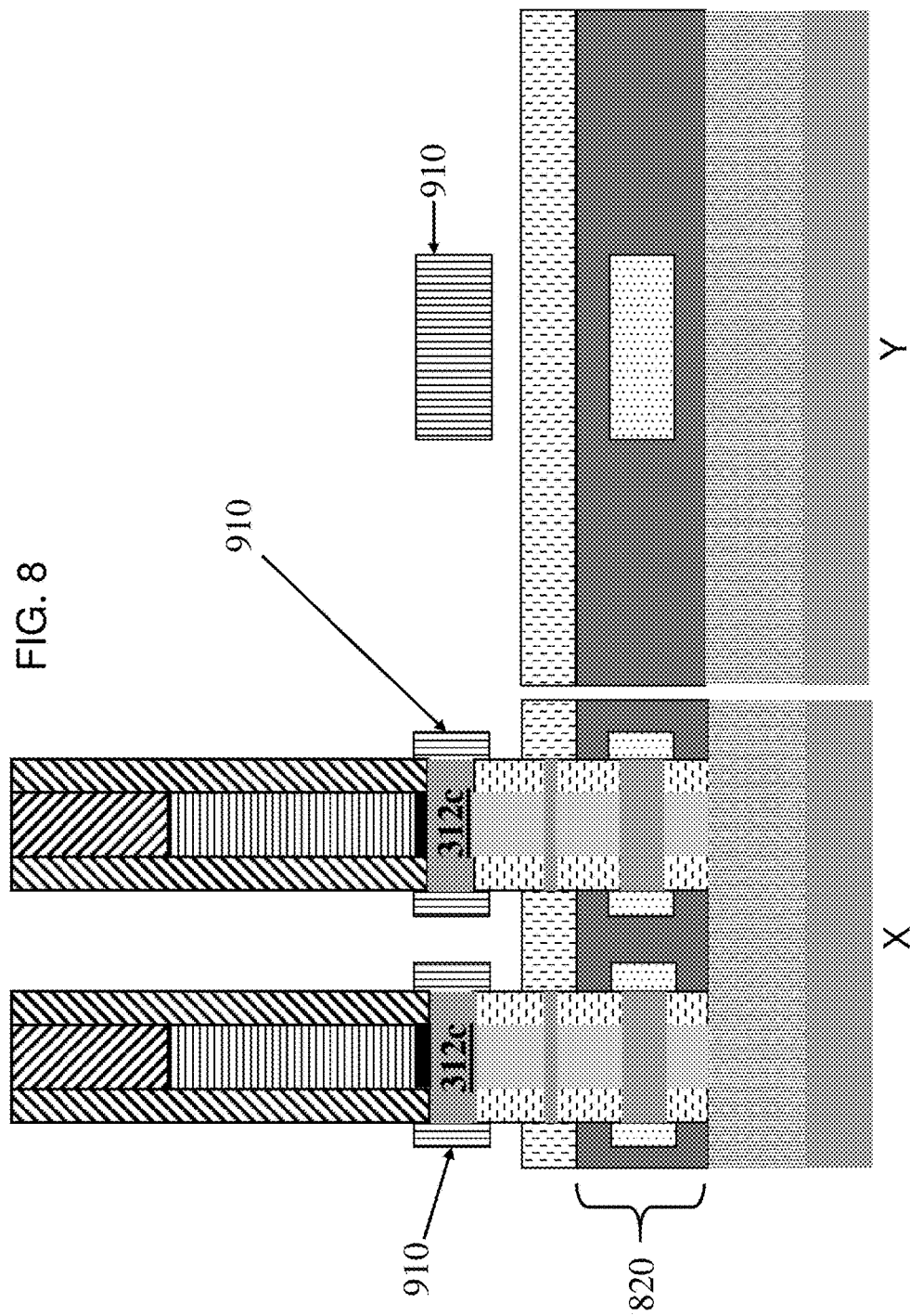
FIG. 8 depicts a second epitaxy growth on nanosheet stack layer edges.

FIG. 8 illustrates epitaxially growth of a second doped material 910 on vertical edges of one or more Si layers 312 located above spacer layer 810, in the specific instance of FIG. 8, on vertical edges of Si layer 312c. If first FET 820 is desired to be an nFET, then first doped material 510 would be n-doped and second doped material 910 would be p-doped, for instance Si:B or SiGe:B. Second doped material 910 is preferably SiGe:B where the SiGe material has a higher percentage of Ge than all other SiGe materials present. For example, second doped material 910 can be $SiGe_{45-65}$:B (i.e., 45% Ge to 65% Ge). It is noted here that the percentage of Ge in the differing SiGe materials determines the etch selectivity of a given SiGe material for a given etchant.

Figure 9:
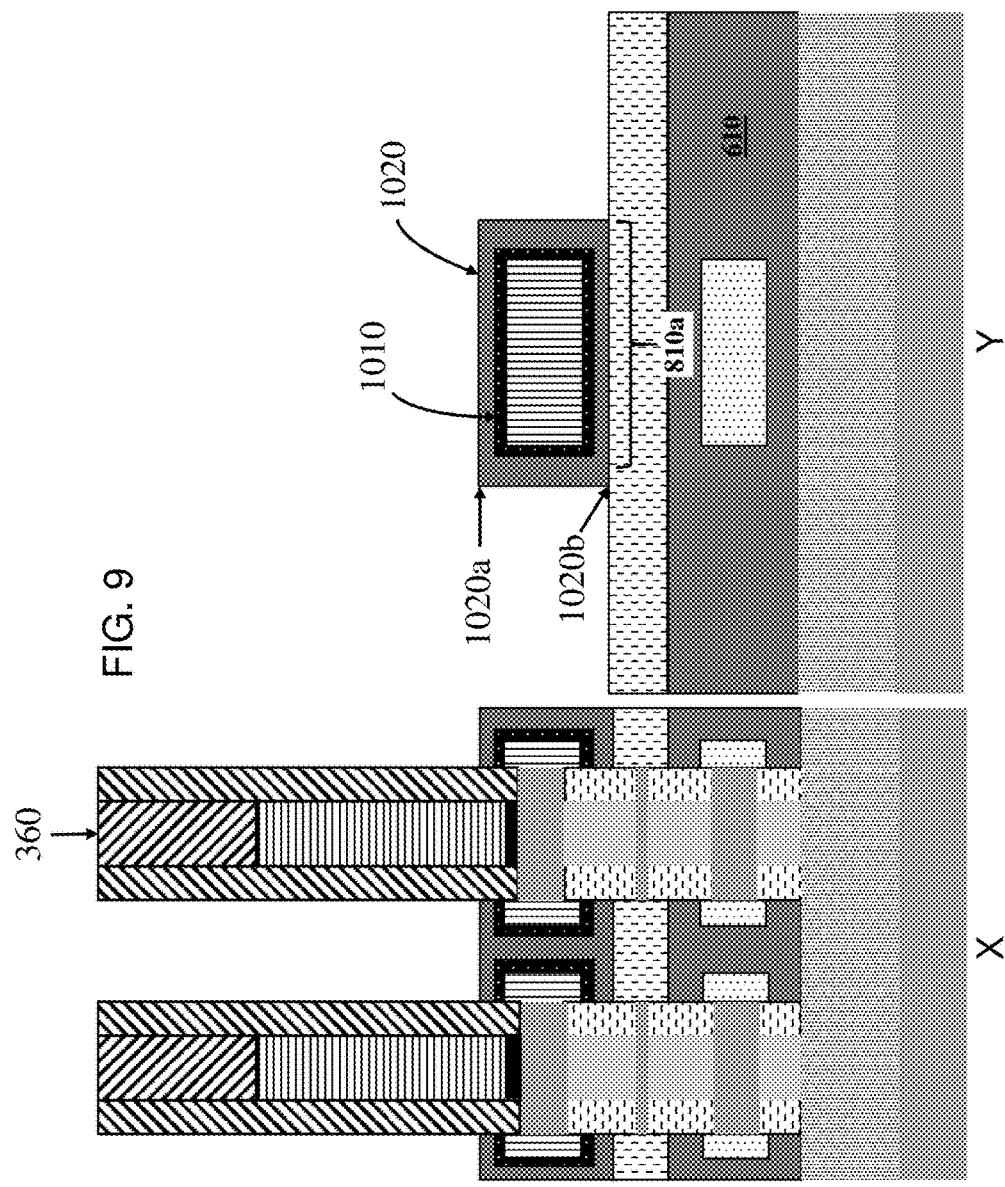
FIG. 9 depicts conformal Si layer formation and encapsulation of the second epitaxy growth.

FIG. 9 illustrates epitaxial growth of a conformal thin Si layer 1010 on surfaces of second doped material 910. Conformal Si layer 1010 is preferably 2 to 3 nanometers thick and made of silicon (Si). FIG. 9 also illustrates epitaxial growth of a second SiGe material 1020 on surfaces of conformal Si layer 1010. Second SiGe material 1020 preferably has a lower percentage of Ge than SiGe nanosheet stack layers 311. Second SiGe material 1020 more preferably has the same percentage of Ge as first SiGe material 610, for instance, $SiGe_{25}$. Second SiGe material 1020 is grown such that a top surface 1020a of second SiGe material 1020 is below hardmask 360 and a bottom surface 1020b of second SiGe material 1020 is on a portion 810a of the top surface of the spacer layer 810.

Figure 10:
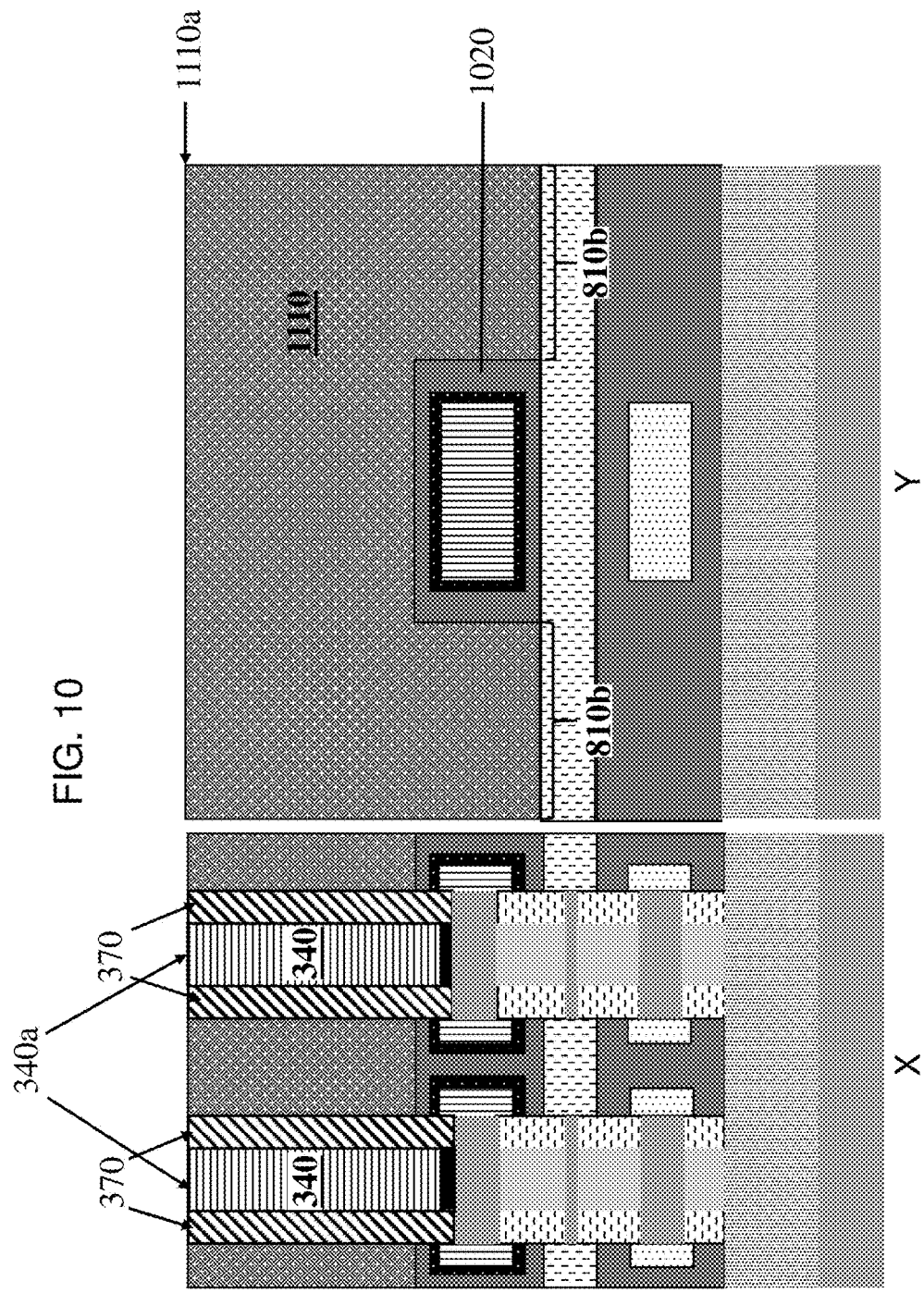
FIG. 10 depicts dielectric layer formation and planarization thereof.

FIG. 10 illustrates forming and planarizing a dielectric layer 1110. Dielectric layer 1110 is formed over second SiGe material 1020, exposed portions 810b of spacer layer 810, gate spacers 370 and hardmask 360 (see FIG. 9 for hardmask 360). Then dielectric layer 1110 is planarized such that a top surface 1110a of dielectric layer 1110 is coplanar with a top surface 340a of dummy gate 340. Dielectric layer 1110 can be planarized by any known or above-discussed planarizing techniques including, but not limited to, CMP. Dielectric layer 1110 can be composed of any dielectric material including, but not limited to, oxides such as $SiO_2$ and nitrides such as SiN. Dielectric layer 1110 can be deposited by any known deposition technique.

Figure 11:
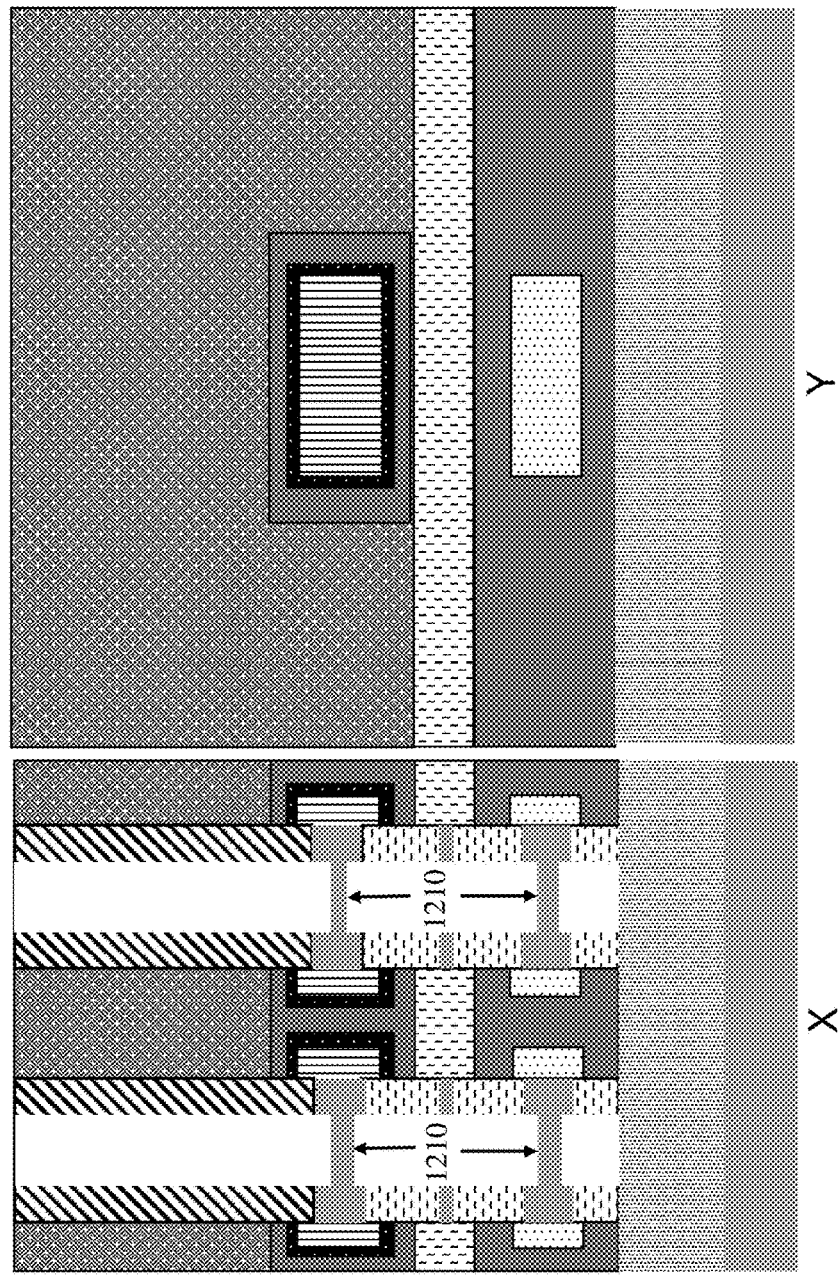
FIG. 11 depicts removal of the dummy gates and specific nanosheet stack layers as well as optional thinning of other nanosheet stack layers.

FIG. 11 illustrates selective removal of dummy gates 340 and SiGe nanosheet stack layers 311 (see white voids in figure). Any known removal process may be used appropriate for the material being removed. During the noted removal, center portions 1210 of Si nanosheet stack layers 312 are reduced in thickness as compared to prior to the noted removal when it is desired to remove one or more intermediary Si layers between FET structures. This reduction in thickness can also be referred to as nanosheet trimming. Such nanosheet trimming is performed with nanometric control and allows for very controlled removal of a middle thin Si mandrel in the gate region in order to form a tall middle inner spacer.

Figure 12:
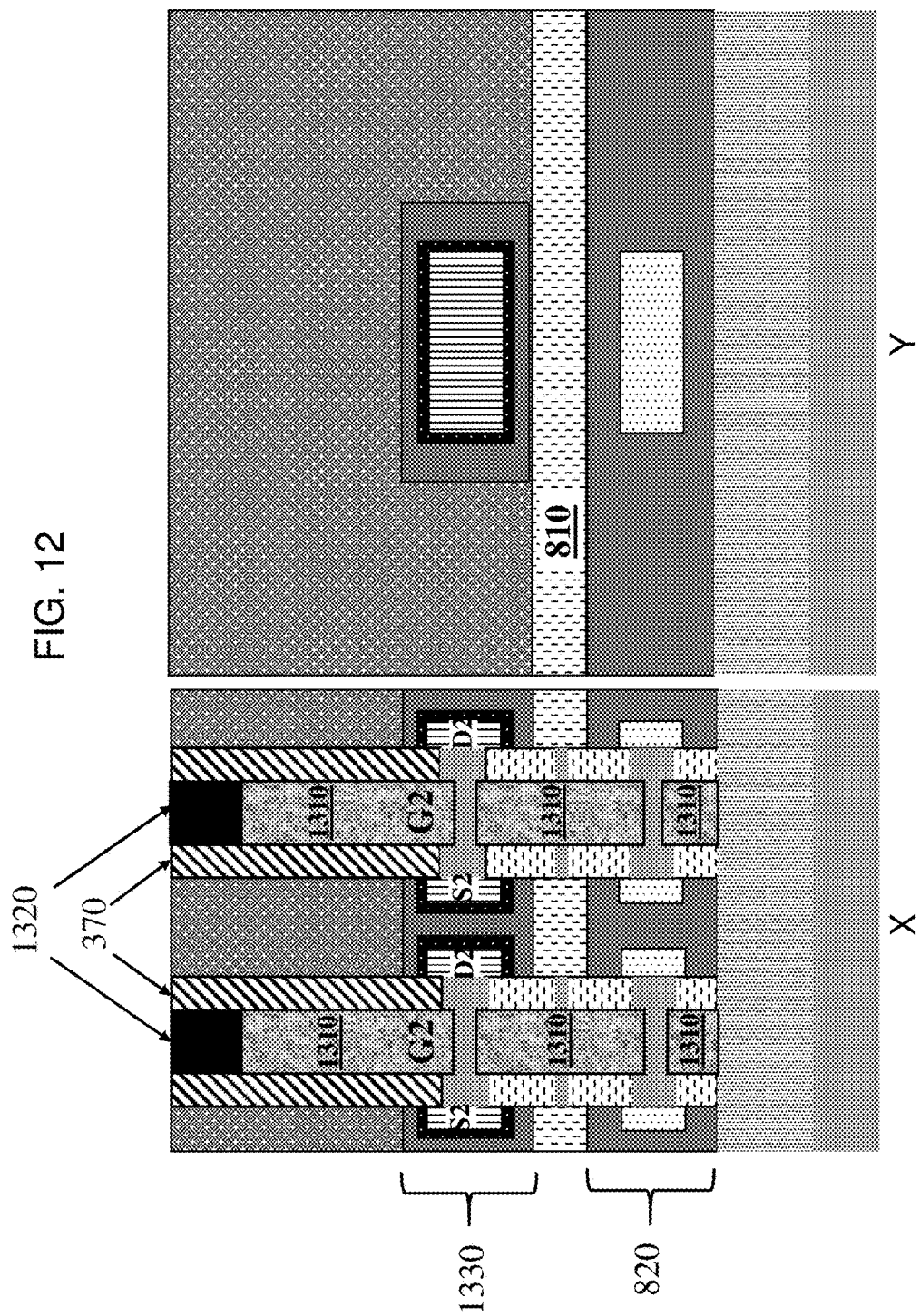
FIG. 12 depicts HKMG and cap formation.

FIG. 12 illustrates forming a high-k metal gate (HKMG) 1310 in place of each dummy gate 340 and SiGe nanosheet stack layer 311 (i.e., forming HKMG 1310 in the locations noted by the white voids in FIG. 11). The high-k dielectric material of HKMG 1310 can be any suitable high-k dielectric material, for example, $HfO_2$ and $ZrO_2$. The metal gate of HKMG 1310 can comprise a work function metal such as TiN, TiC, TiAl, TaN, etc. and can further comprise one or more low resistance conducting metals such as W, Co and Ru.

FIG. 12 also shows forming a cap 1320 on a top-most surface of HKMG 1310. Cap 1320 can be formed of one or more of $Si_3N_4$, SiBCN, SiNC, SiN, SiCO, $SiO_2$ and SiNOC. Cap 1320 can be formed of the same material or different material from that of gate spacers 370.

The summation of the processing as shown in FIG. 8 through FIG. 12 produces a second FET structure 1330 having dielectric layer 1110 thereover, having spacer layer 810 thereunder and being vertically stacked above first FET 820. Second FET structure 1330 has at least one second gate (G2), at least one second source (S2) and at least one second drain (D2) (see FIG. 12). For illustration purposes only, FIG. 12 depicts two second gates G2, two second sources S2 and two second drains D2. Any number of gate/source/drain combinations can be used. In some embodiments of the disclosure, first gate (G1) of first FET structure 820 and second gate (G2) of second FET structure 1330 are formed at the same time during processing and are electrically connected.

FIG. 13 through FIG. 17 illustrate formation of a first lateral conductive metal region and a first vertical conductive metal region that provide a wrap-around contact for the first FET, and a second vertical conductive metal region that provides a wrap-around contact for the second FET.

Figure 13:
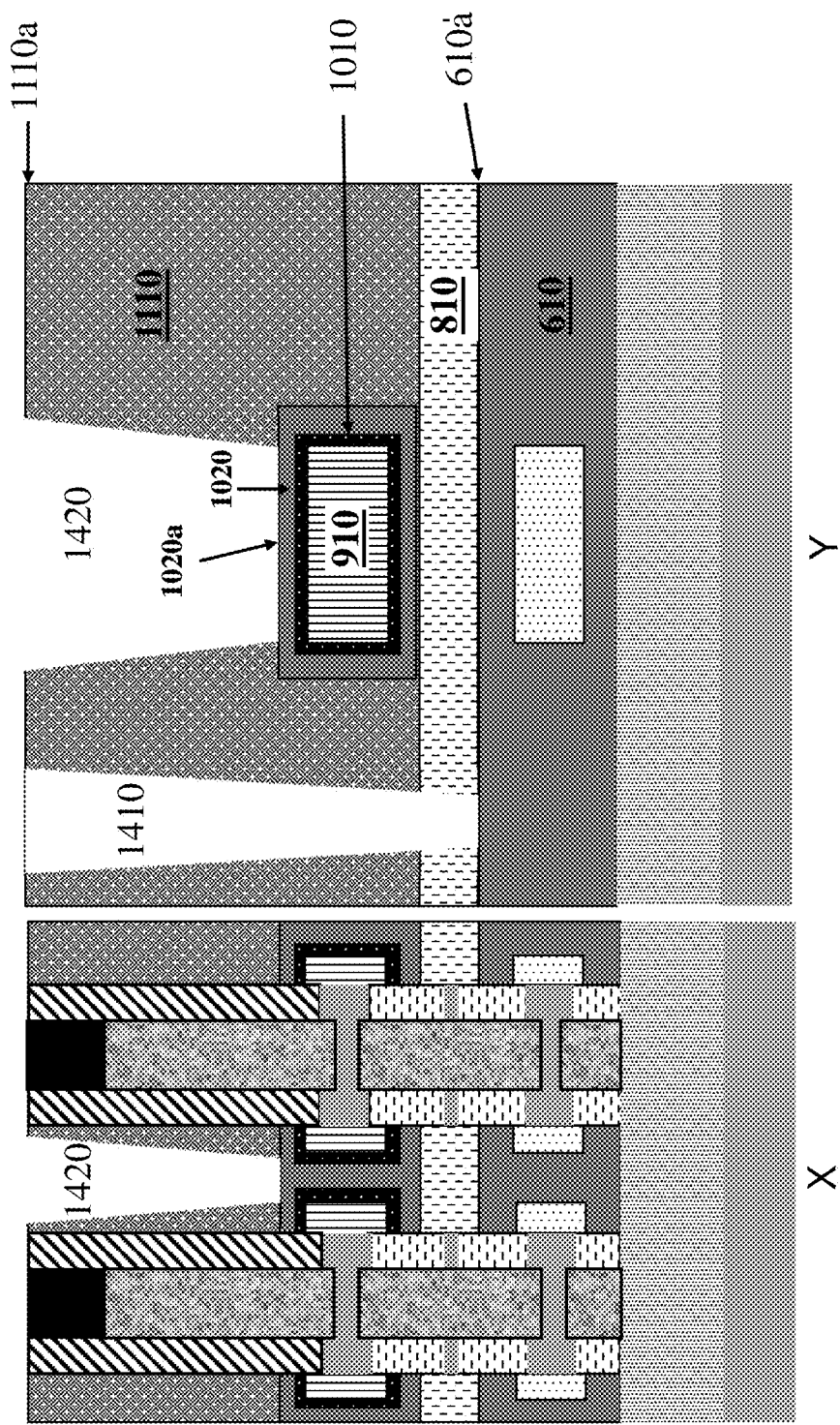
FIG. 13 depicts formation of a first vertical contact opening and a second vertical contact opening.

FIG. 13 illustrates forming a first vertical contact opening 1410. First vertical contact opening 1410 extends from top surface 1110a of dielectric layer 1110, through dielectric layer 1110, through spacer layer 810 and to top surface 610a' of first SiGe material 610. First vertical contact opening 1410 allows for access to first source (S1) and first drain (D1) of first FET structure 820. FIG. 13 also illustrates forming a second vertical contact opening 1420. Second vertical contact opening 1420 extends from top surface 1110a of dielectric layer 1110, through a portion of dielectric layer 1110, around second doped material 910 having conformal Si layer 1010 thereon and to top surface 1020a of second SiGe material 1020. Second vertical contact opening 1420 allows for access to second source (S2) and second drain (D2) of second FET structure 1330. First and second vertical contact openings 1410, 1420 can be formed by an etching technique, for instance directional (anisotropic) etching. First and second vertical contact openings 1410, 1420 do not merge and/or intersect.

Figure 14:
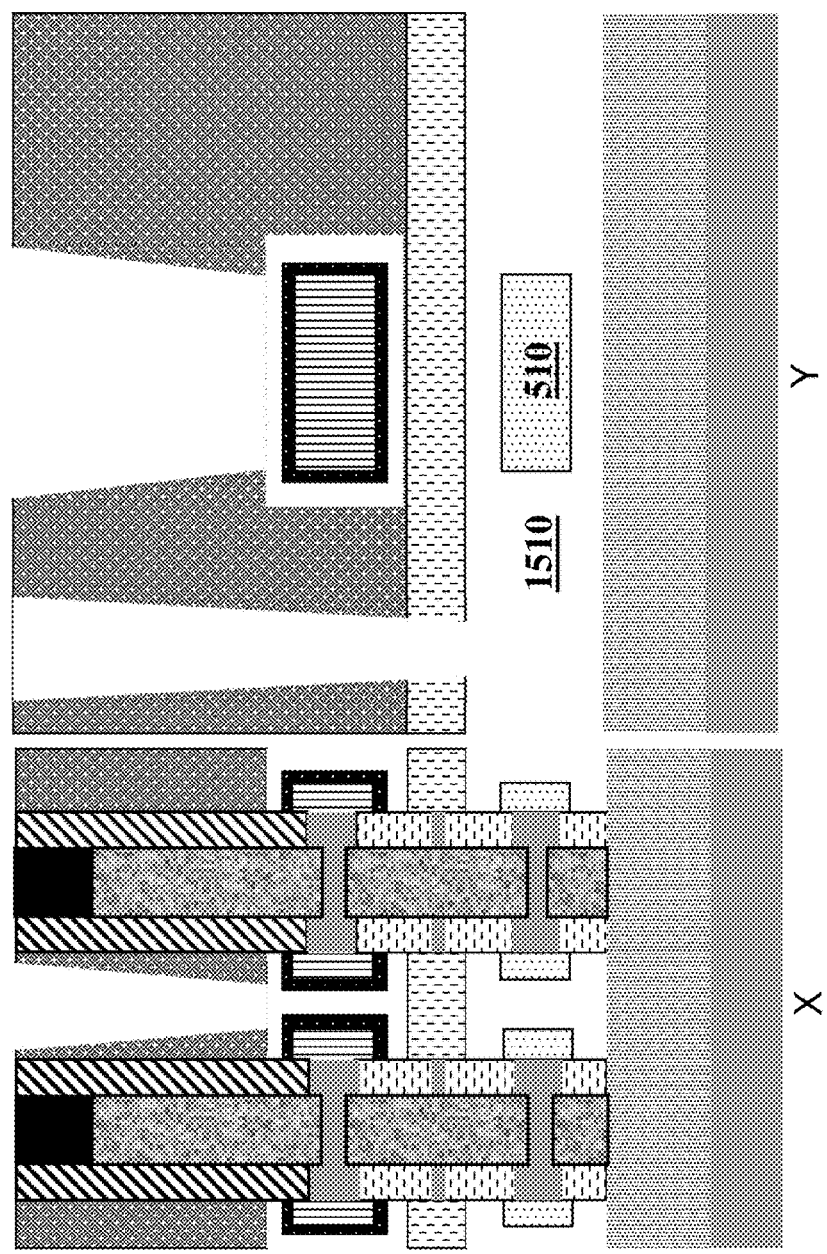
FIG. 14 depicts formation of a lateral contact opening and continued opening of the second vertical contact opening by selective removal of a sacrificial encapsulation of the first and second Epitaxies in order to form two wrap-around-contact cavities.

FIG. 14 illustrates selectively removing first and second SiGe materials 610, 1020 through first and second vertical contact openings 1410, 1420. Removal of first SiGe material 610 forms lateral contact opening 1510 around first doped material 510. The noted removal may be performed by an etching technique, preferably isotropic etching. It is noted here that conformal Si layer 1010 on second doped material 910 acts as an etch stop during etching.

Figure 15:
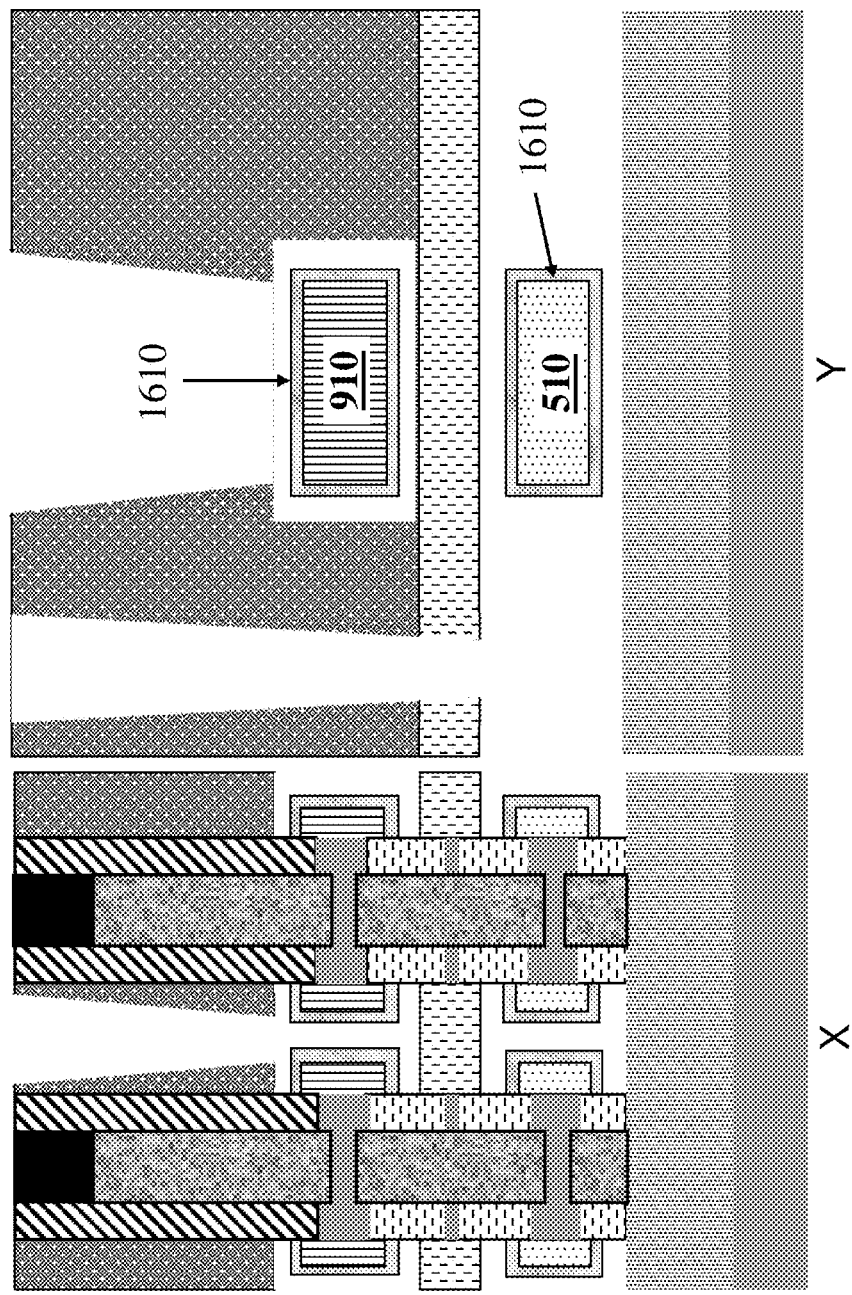
FIG. 15 depicts conformal silicide layer formation.

FIG. 15 illustrates forming a conformal silicide layer 1610 on first doped material 510 and second doped material 910. The conformal silicide layer 1610 on first doped material 510 is formed by performing a silicidation process on exposed surfaces of first doped material 510, whereas conformal silicide layer 1610 on second doped material 910 is formed by performing a silicidation process on conformal Si layer 1010 present on second doped material 910.

Figure 16:
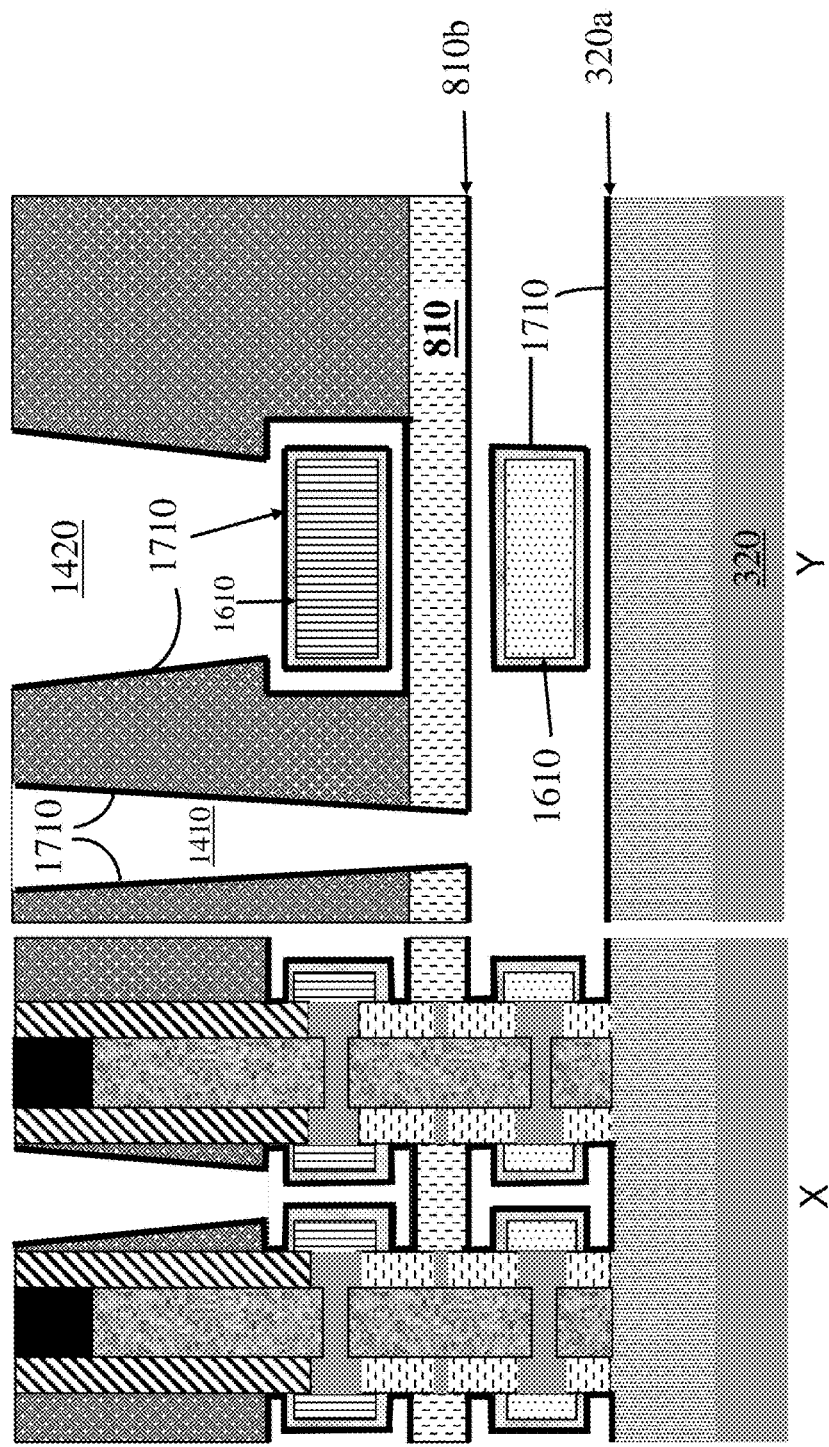
FIG. 16 depicts conformal liner formation.

FIG. 16 illustrates forming a conformal liner 1710 on walls of first and second vertical contact openings 1410, 1420, bottom surface 810b of spacer layer 810, top surface 320a of substrate 320 and surfaces of conformal silicide layer 1610. Conformal liner 1710 may be composed of any liner material compatible with the metal to be later filled and in contact therewith. Conformal liner 1710 may, for example, be composed of TiN.

Figure 17:
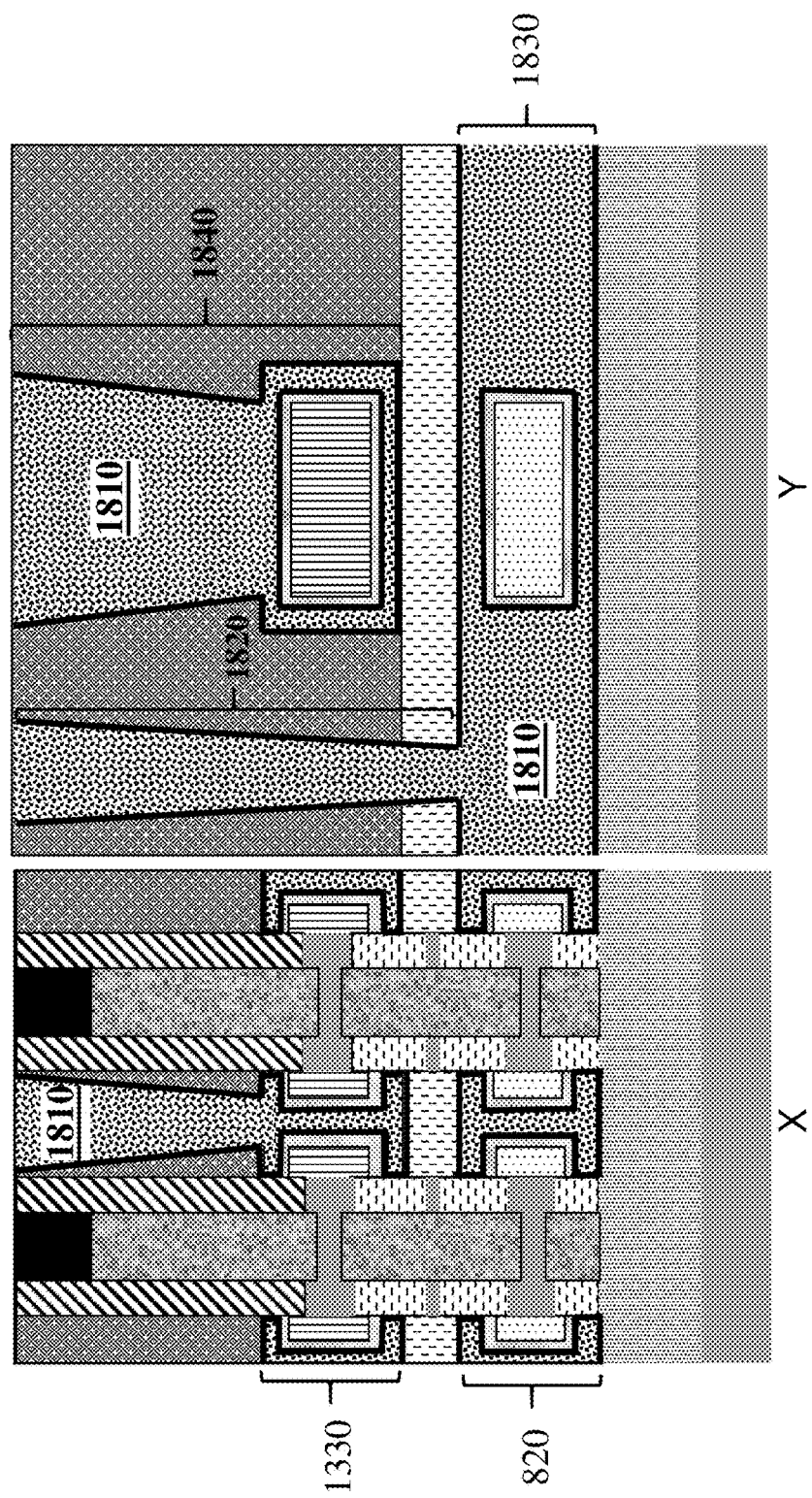
FIG. 17 depicts filling of the first and second vertical contact openings and the lateral contact opening.

FIG. 17 illustrates conformal filling open spaces of first vertical contact opening 1410, lateral contact opening 1510 and second vertical contact opening 1420 with a conductive metal 1810. The filling of first vertical contact opening 1410 and lateral contact opening 1510 with conductive metal 1810 forms a first vertical conductive metal region 1820 and a first lateral conductive metal region 1830 mentioned above, respectively, which in turn provides a wrap-around contact for first FET 820 (a bottom FET in relation to second FET 1330). The filling of second vertical contact opening 1420 with conductive metal 1810 forms a second vertical conductive metal region 1840 which in turn provides a wrap-around contact for second FET 1330 (a top FET in relation to first FET 820).

Now turning to a second embodiment of the structures of the disclosure, FIG. 18 through FIG. 34 will be discussed. The second embodiment differs from the first embodiment in that the formation processes are like photographic negatives of one another. In other words, in the first embodiment the individual wrap around contacts are formed by filling individual openings that wrap around the FETs with metal whereas in the second embodiment the individual wrap around contacts are formed by filling separation openings in a collective (or common) wrap around contact with an isolation material.

Formation of the second embodiment of the structures of the disclosure begins with the same steps as those described and shown in FIG. 2 through FIG. 4. Thus, FIG. 18 is the first figure specific to the second embodiment and continues from FIG. 4.

Figure 18:
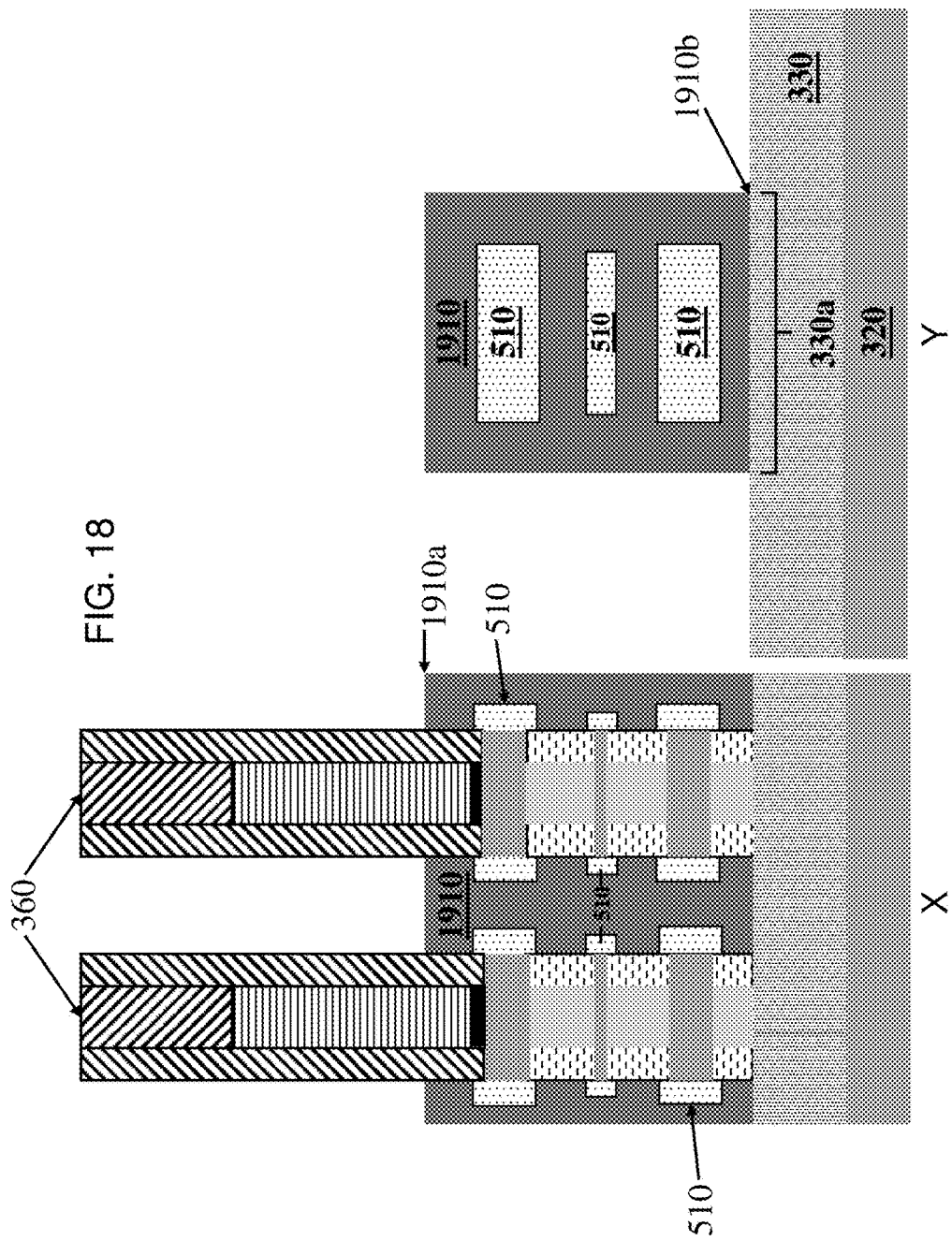
FIG. 18 and subsequent figures represent an embodiment different from that of FIGS. 5-17 (but has initial FIGS. 2-4 in common).

FIG. 18 illustrates epitaxial growth of a first SiGe material 1910 on surfaces of first doped material 510. First SiGe material 1910 has a lower percentage of Ge than SiGe layers 311 of nanosheet stack 310. First SiGe material 1910 can be, for instance, $SiGe_{25}$ when SiGe layers 311 are, for instance, $SiGe_{30-60}$ (as noted above). First SiGe material 1910 is grown such that a top surface 1910a of first SiGe material 1910 is below hardmask 360 and a bottom surface 1910b of first SiGe material 1910 is on a portion of the top surface of substrate 320 or, in the presence of insulating layer 330 as is the case for FIG. 18, on a portion 330a of the top surface of insulating layer 330.

Figure 19:
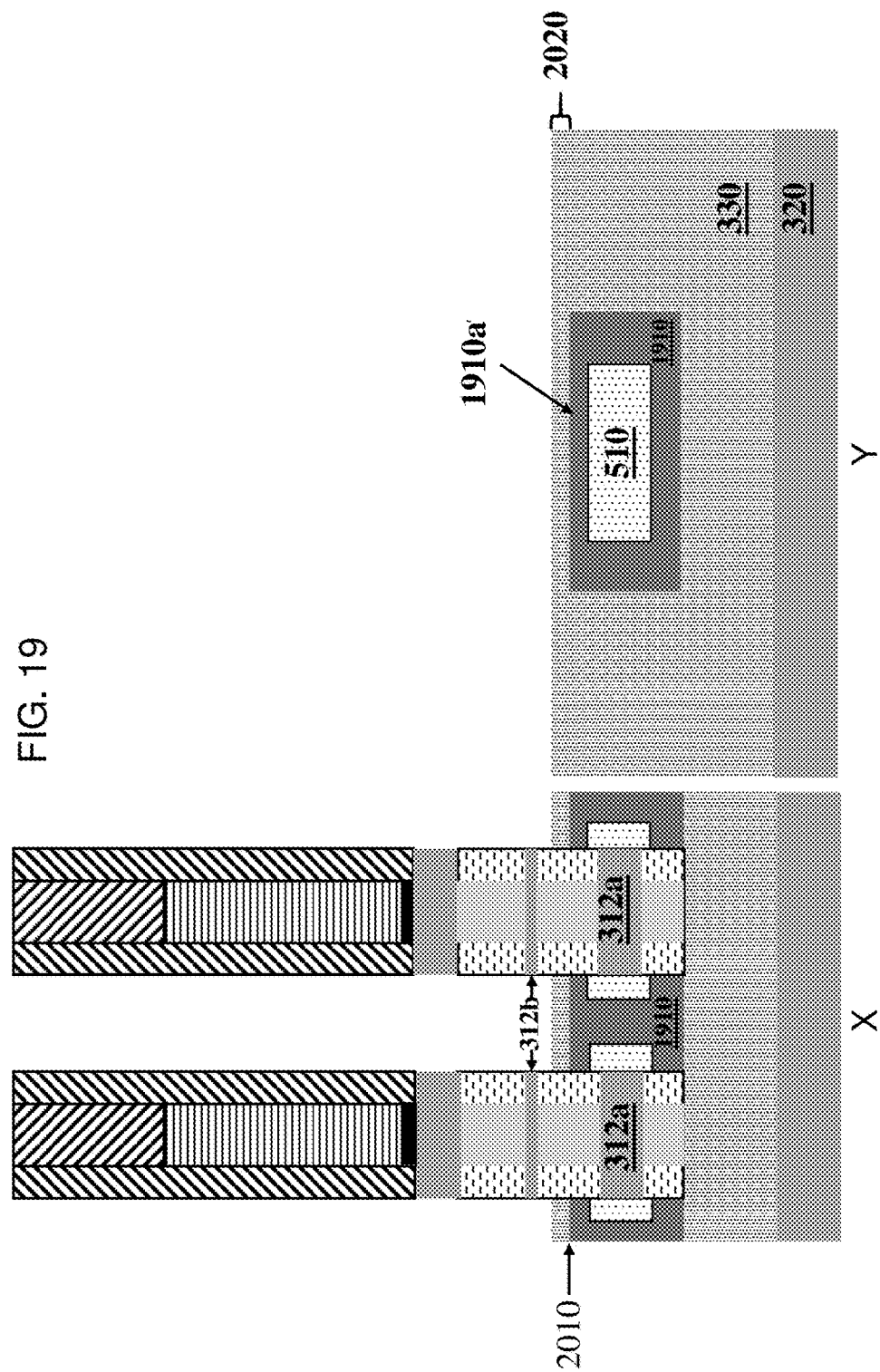
FIG. 19 depicts etch-back of the first different epitaxy growth and isolation layer formation.

FIG. 19 illustrates etching of first SiGe material 1910 and first doped material 510. The etching is performed such that all of first SiGe material 1910 and all of first doped material 510 above a certain level 2010 is removed. Level 2010 is vertically located between any two Si layers 312. In the instance of FIG. 19, level 2010 is located between Si layer 312a and Si layer 312b. FIG. 19 also illustrates forming an isolation layer 2020 over a top surface 1910a' of etched first SiGe material 1910 wherein isolation layer 2020 extends horizontally beyond edges of first SiGe material 1910. Isolation layer 2020 preferably has a thickness of 4 to 10 nanometers. Isolation layer 2020 may be composed of any insulative material and may be composed of the same or different material as that of insulating layer 330 discussed above.

Figure 20:
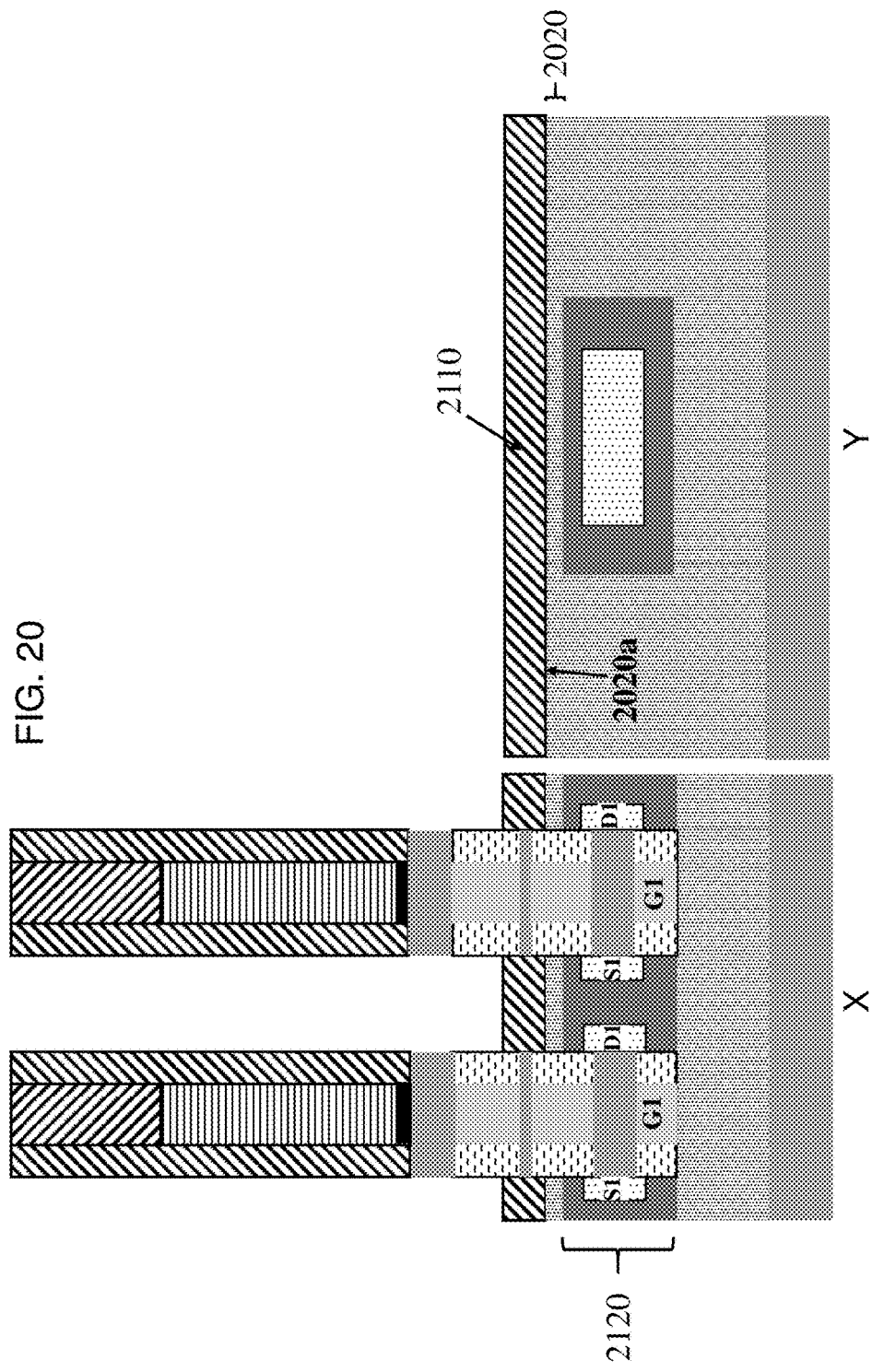
FIG. 20 depicts source/drain Epitaxy spacer layer formation.

FIG. 20 illustrates forming a spacer layer 2110 on a top surface 2020a of isolation layer 2020. Spacer layer 2110 is preferably 5 to 10 nanometers thick. Spacer layer 2110 electrically disconnects a first source and a first drain of a first (bottom) FET structure from a second source and a second drain of a second (top) FET structure; the first and second FET structures being described below. Spacer layer 2110 may be deposited by any above-discussed depositing technique including, for example, gas cluster ion beam (GCIB) deposition or deposition/etch cycles using anisotropic high-density plasma (HDP) deposition combined with isotropic etch back.

The summation of the processing as shown in FIG. 2 through FIG. 4 followed by FIG. 18 through 20 produces a first FET structure 2120 having isolation layer 2020 and spacer layer 2110 thereon (in that order). First FET structure 2120 has at least one first gate region (G1) (filled with sacrificial SiGe at this stage), at least one first source (S1) and at least one first drain (D1) (see FIG. 20). For illustration purposes only, FIG. 20 depicts two first gate regions G1, two first sources S1 and two first drains D1. Any number of gate region/source/drain combinations can be used.

Figure 21:
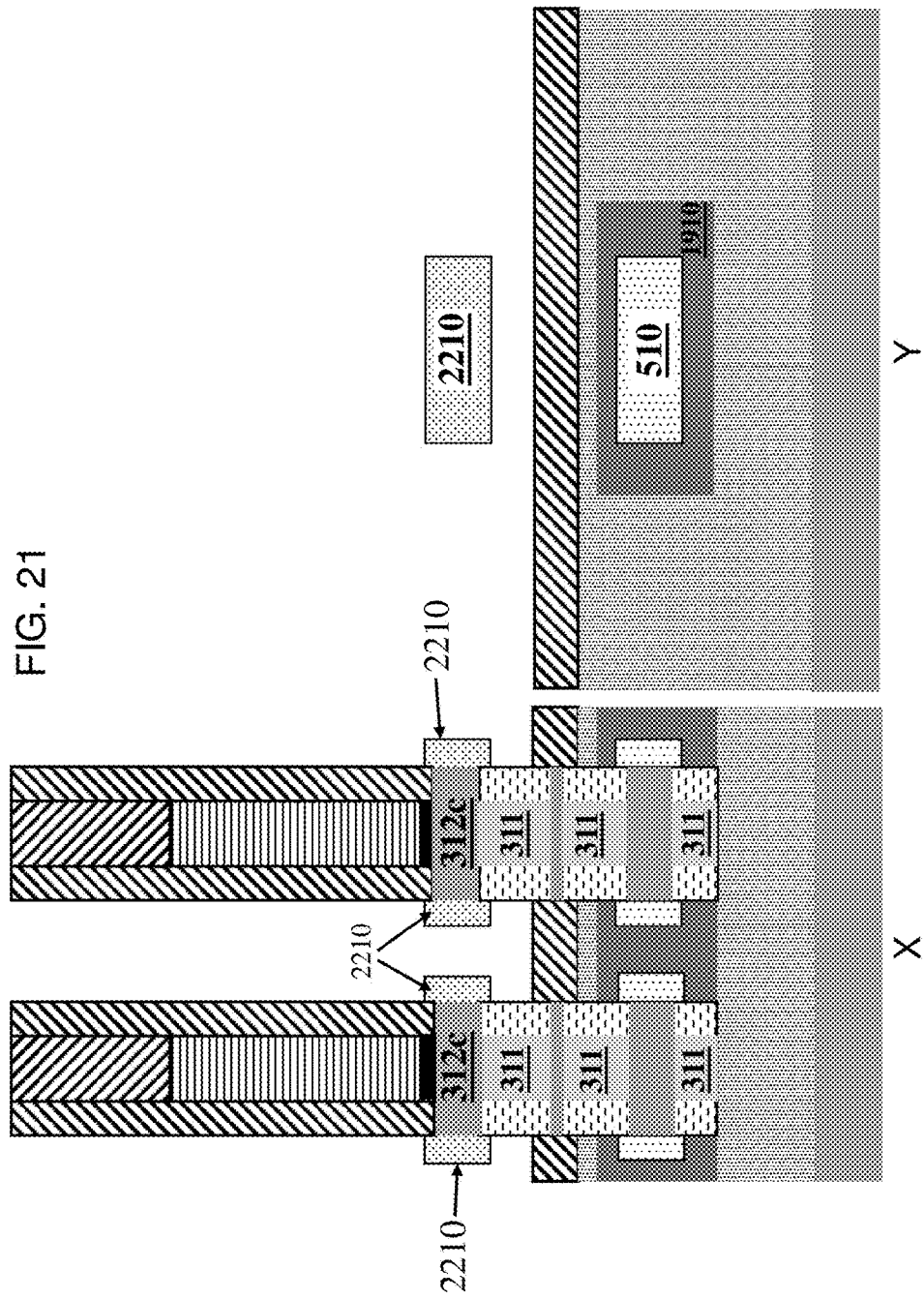
FIG. 21 depicts a second epitaxy growth on nanosheet stack layer edges.

FIG. 21 illustrates epitaxial growth of a second doped material 2210. Second doped material 2210 is grown on vertical edges of one or more Si layers 312 located above spacer layer 2110, in the specific instance of FIG. 21, on vertical edges of Si layer 312c. If first FET 2120 is desired to be an nFET, then first doped material 510 would be n-doped and second doped material 2210 would be p-doped, for instance Si:B or SiGe:B. Second doped material 2210 is preferably SiGe:B where the SiGe material has a higher percentage of Ge than all other SiGe materials present. For example, second doped material 2210 can be $SiGe_{45-65}$:B (i.e., 45% Ge to 65% Ge). It is again noted that the percentage of Ge in the differing SiGe materials determines the etch selectivity of a given SiGe material for a given etchant.

Figure 22:
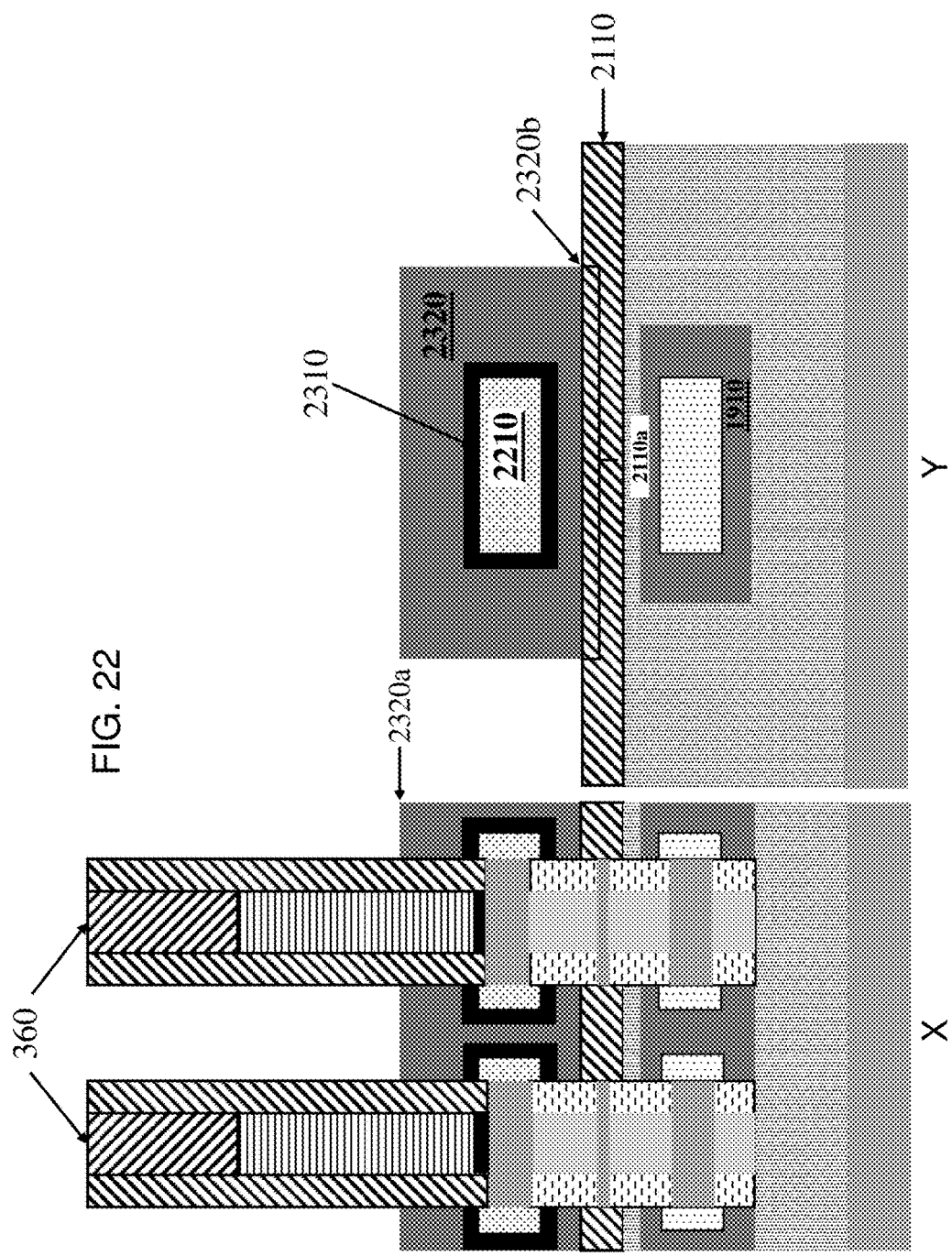
FIG. 22 depicts conformal Si layer formation and encapsulation of the second epitaxy growth, and a second different epitaxy growth on the conformal Si layer.

FIG. 22 illustrates epitaxial growth of a conformal thin Si layer 2310 on surfaces of second doped material 2210. Conformal Si layer 2310 is preferably 2 to 3 nanometers thick and made of silicon (Si). FIG. 22 also illustrates epitaxial growth of a second SiGe material 2320 on surfaces of conformal Si layer 2310. Second SiGe material 2320 preferably has a lower percentage of Ge than SiGe nanosheet stack layers 311. Second SiGe material 2320 more preferably has the same percentage of Ge as first SiGe material 1910, for instance, $SiGe_{25}$. Second SiGe material 2320 is grown such that a top surface 2320a of second SiGe material 2320 is below hardmask 360 and a bottom surface 2320b of second SiGe material 2320 is on a portion 2110a of the top surface of the spacer layer 2110.

Figure 23:
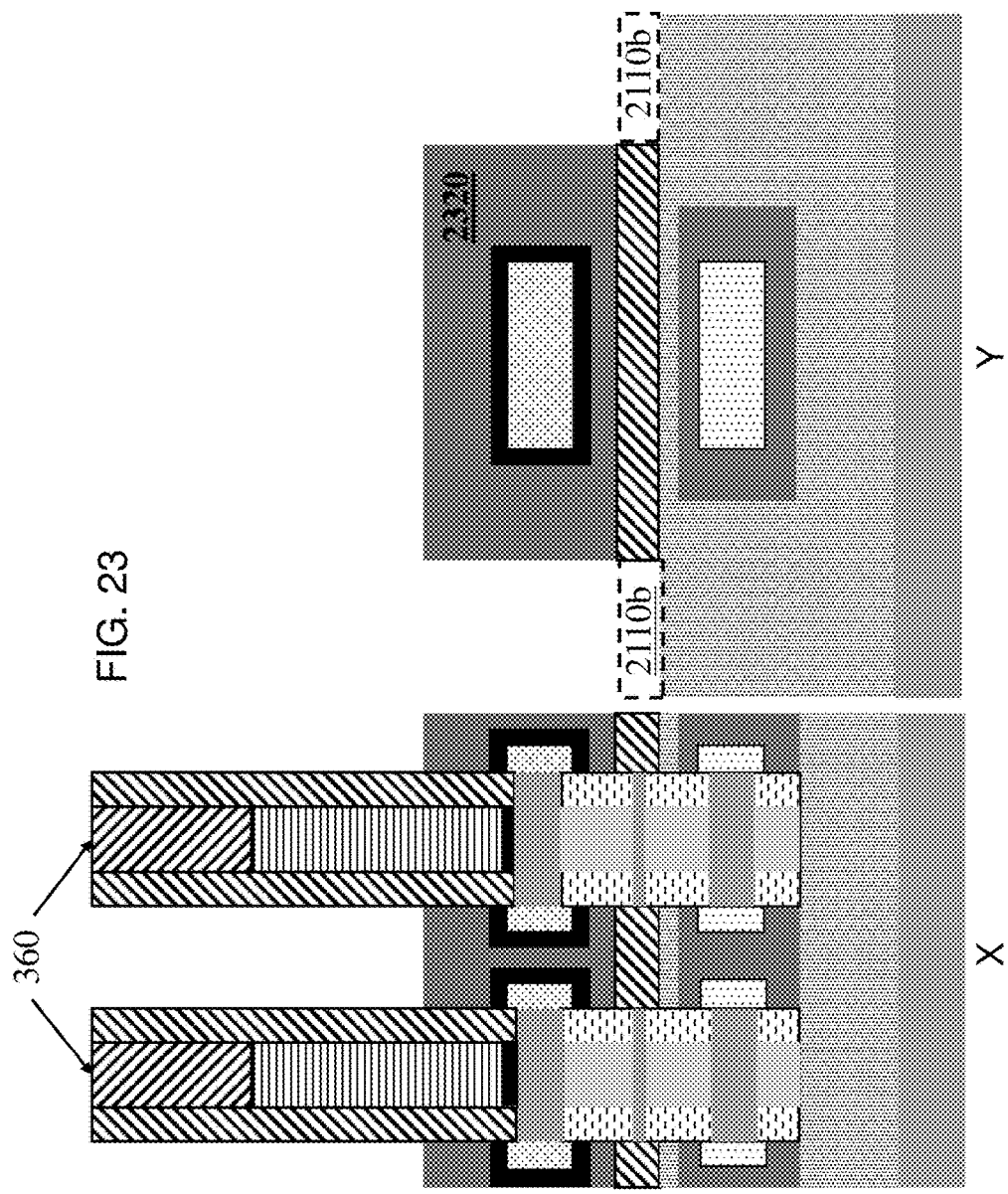
FIG. 23 depicts partial spacer layer removal.

FIG. 23 illustrates selective removal of portions 2110b (shown in phantom via dotted lines) of spacer layer 2110 that are not located underneath second SiGe material 2320. The noted removal can be performed by any known removal technique appropriate for the material to be removed including, but not limited to, etching, such as directional etching.

Figure 24:
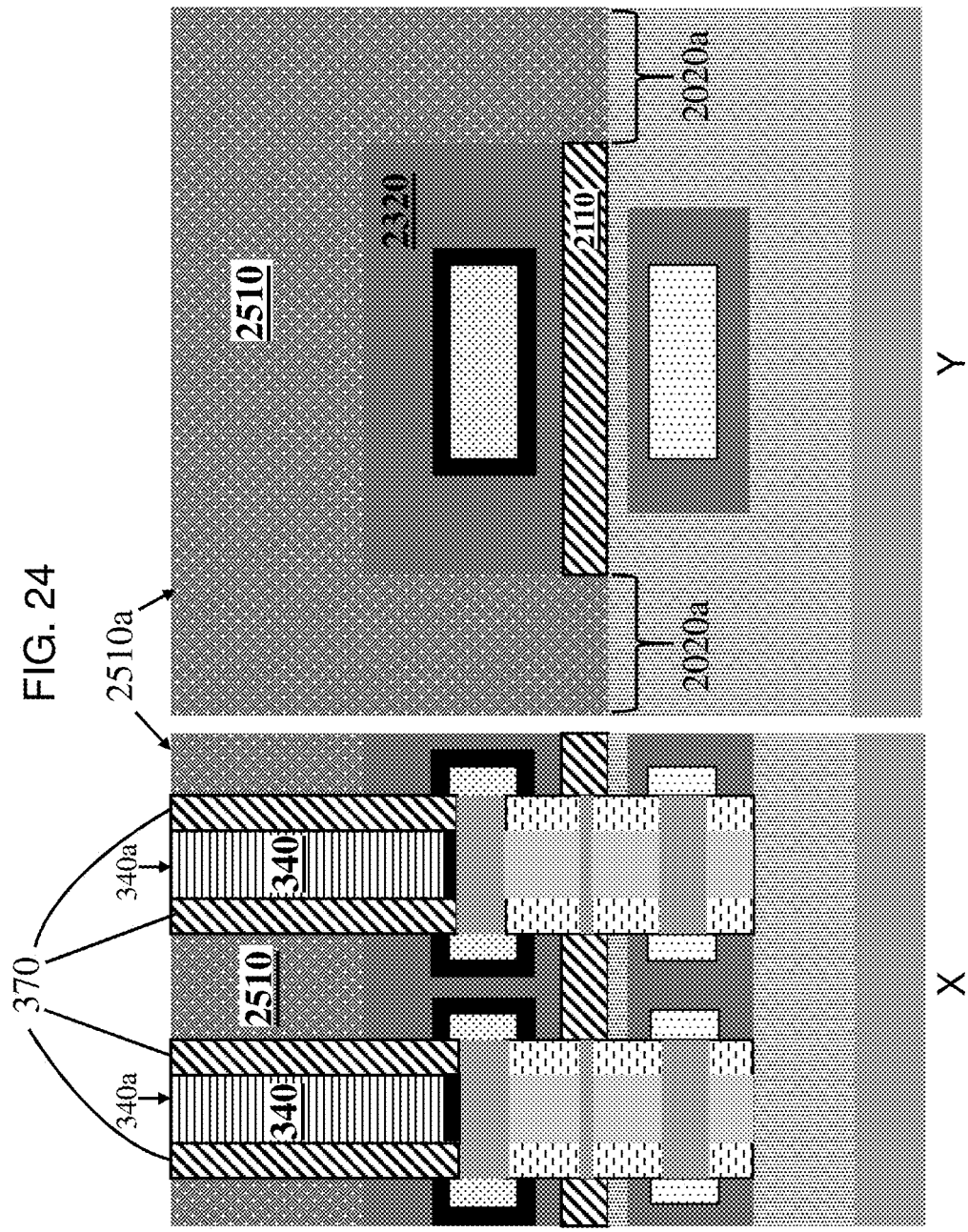
FIG. 24 depicts dielectric layer formation and planarization thereof.

FIG. 24 illustrates forming and planarizing a dielectric layer 2510. Dielectric layer 2510 is formed on second SiGe material 2320, edges of spacer layer 2210, exposed top surfaces 2020a of isolation layer 2020, gate spacers 370 and hardmask 360 (see FIG. 23 for hardmask 360). Then dielectric layer 2510 is planarized such that a top surface 2510a of dielectric layer 2510 is coplanar with a top surface 340a of dummy gate 340. Dielectric layer 2510 can be planarized by any known or above-discussed planarizing techniques including, but not limited to, CMP. Dielectric layer 2510 can be composed of any dielectric material including, but not limited to, oxides such as SiO2 and nitrides such as SiN. Dielectric layer 2510 can be deposited by any known deposition technique.

Figure 25:
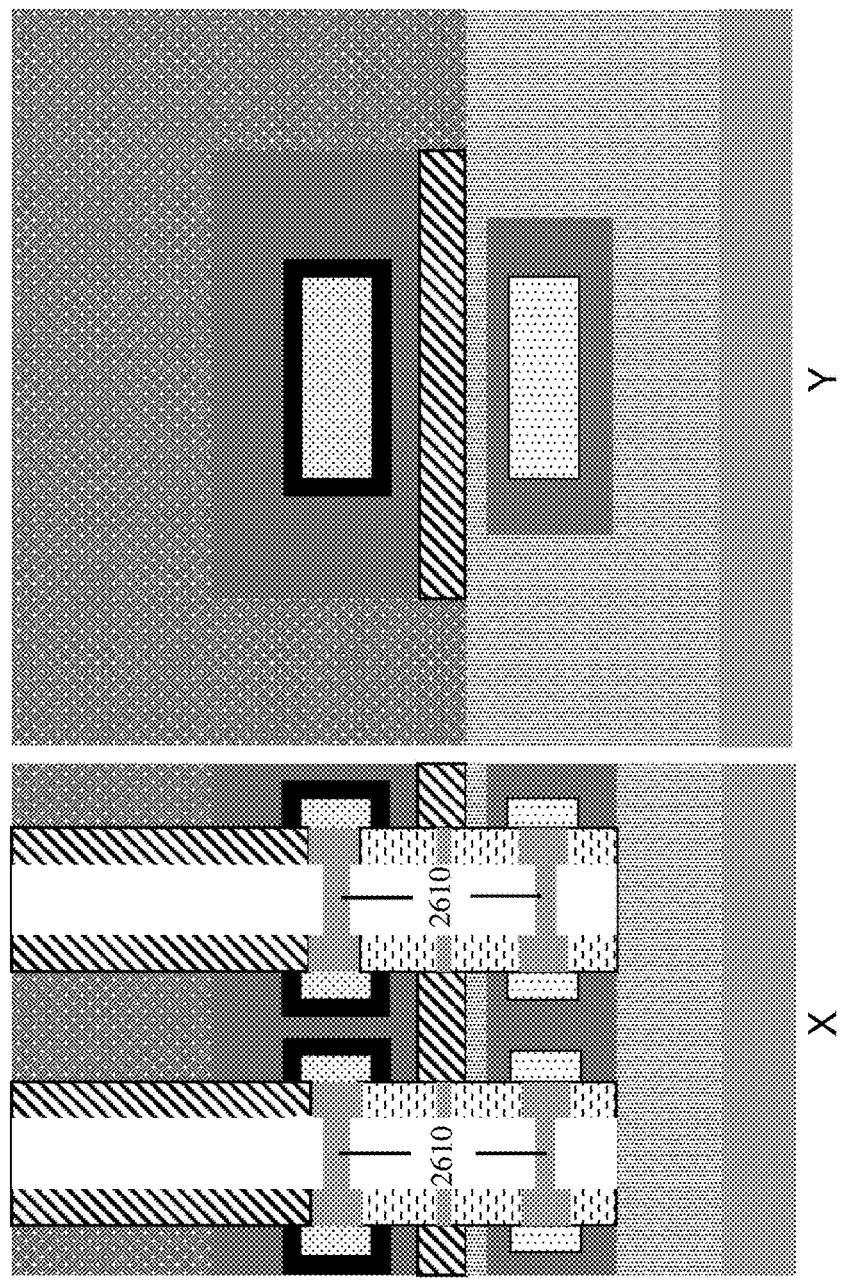
FIG. 25 depicts removal of the dummy gates and specific nanosheet stack layers as well as optional thinning of other nanosheet stack layers.

FIG. 25 illustrates selective removal of dummy gates 340 and SiGe nanosheet stack layers 311 (see white voids in figure). Any known removal process may be used appropriate for the material being removed. During the noted removal, center portions 2610 of Si nanosheet stack layers 312 are reduced in thickness as compared to prior to the noted removal when it is desired to remove one or more intermediary Si layers between FET structures. This reduction in thickness can also be referred to as nanosheet trimming. Such nanosheet trimming is performed with nanometric control and allows for very controlled removal of a middle thin Si mandrel in the gate region in order to form a tall middle inner spacer.

Figure 26:
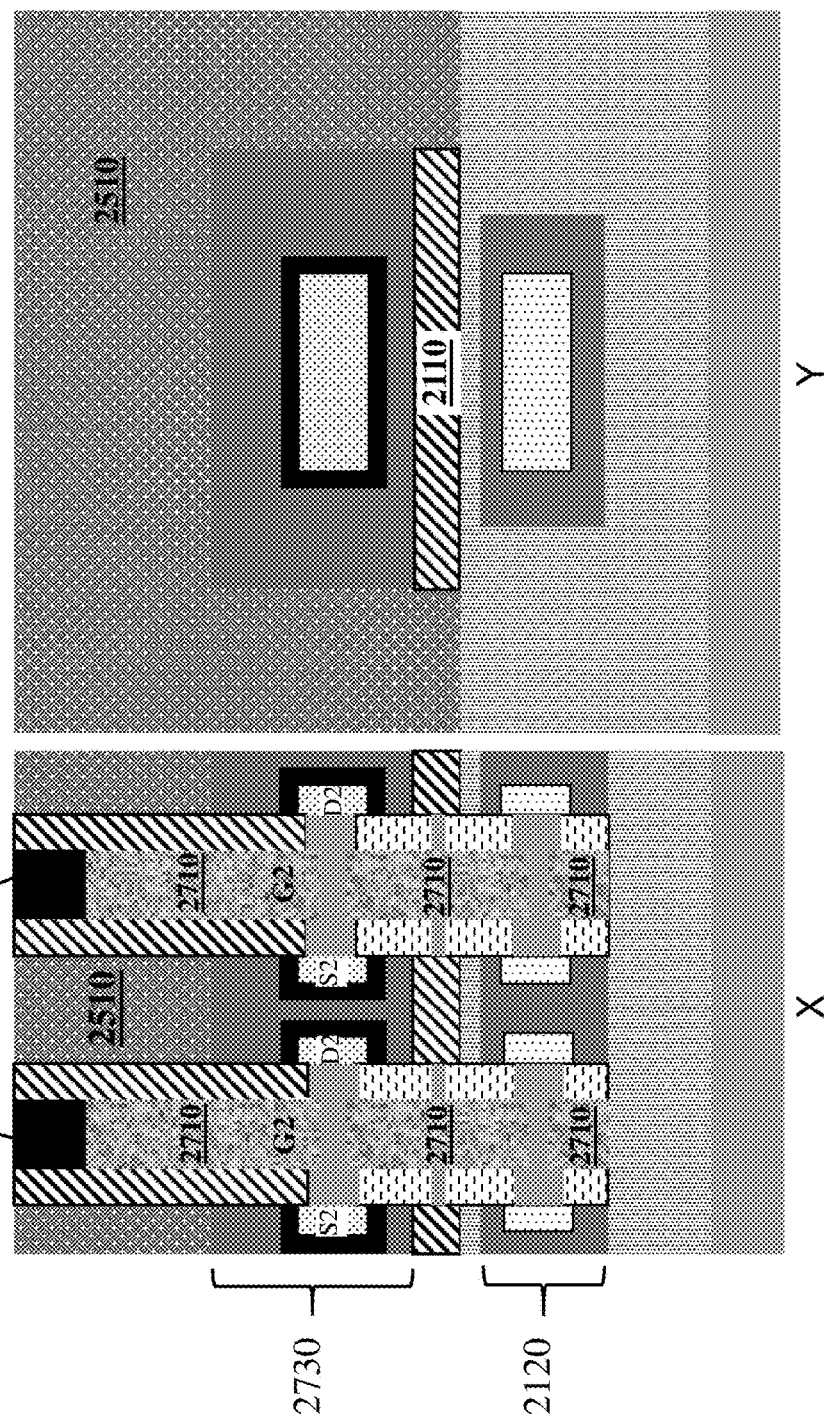
FIG. 26 depicts HKMG and cap formation.

FIG. 26 illustrates forming a high-k metal gate (HKMG) 2710 in place of each dummy gate 340 and SiGe nanosheet stack layer 311 (i.e., forming HKMG 2710 in the locations noted by the white voids in FIG. 25). The high-k dielectric material of HKMG 2710 can be any suitable high-k dielectric material, for example, $HfO_2$ and $ZrO_2$. The metal gate of HKMG 2710 can comprise a work function metal such as TiN, TiC, TiAl, TaN, etc. and can further comprise one or more low resistance conducting metals such as W, Co and Ru.

FIG. 26 also shows forming a cap 2720 on a top-most surface of HKMG 2710. Cap 2720 can be formed of one or more of $Si_3N_4$, SiBCN, SiNC, SiN, SiCO, $SiO_2$, SiNOC, etc. . . . . Cap 2720 can be formed of the same material or different material from that of gate spacers 370.

The summation of the processing as shown in FIG. 21 through FIG. 26 produces a second FET structure 2730 having dielectric layer 2510 thereover, having spacer layer 2210 thereunder and being vertically stacked above first FET 2120. Second FET structure 2730 has at least one second gate (G2), at least one second source (S2) and at least one second drain (D2) (see FIG. 26). For illustration purposes only, FIG. 26 depicts two second gates G2, two second sources S2 and two second drains D2. Any number of gate/source/drain combinations can be used.

FIG. 27 through FIG. 30 illustrates formation of a wrap-around contact encompassing the first and second FETs.

Figure 27:
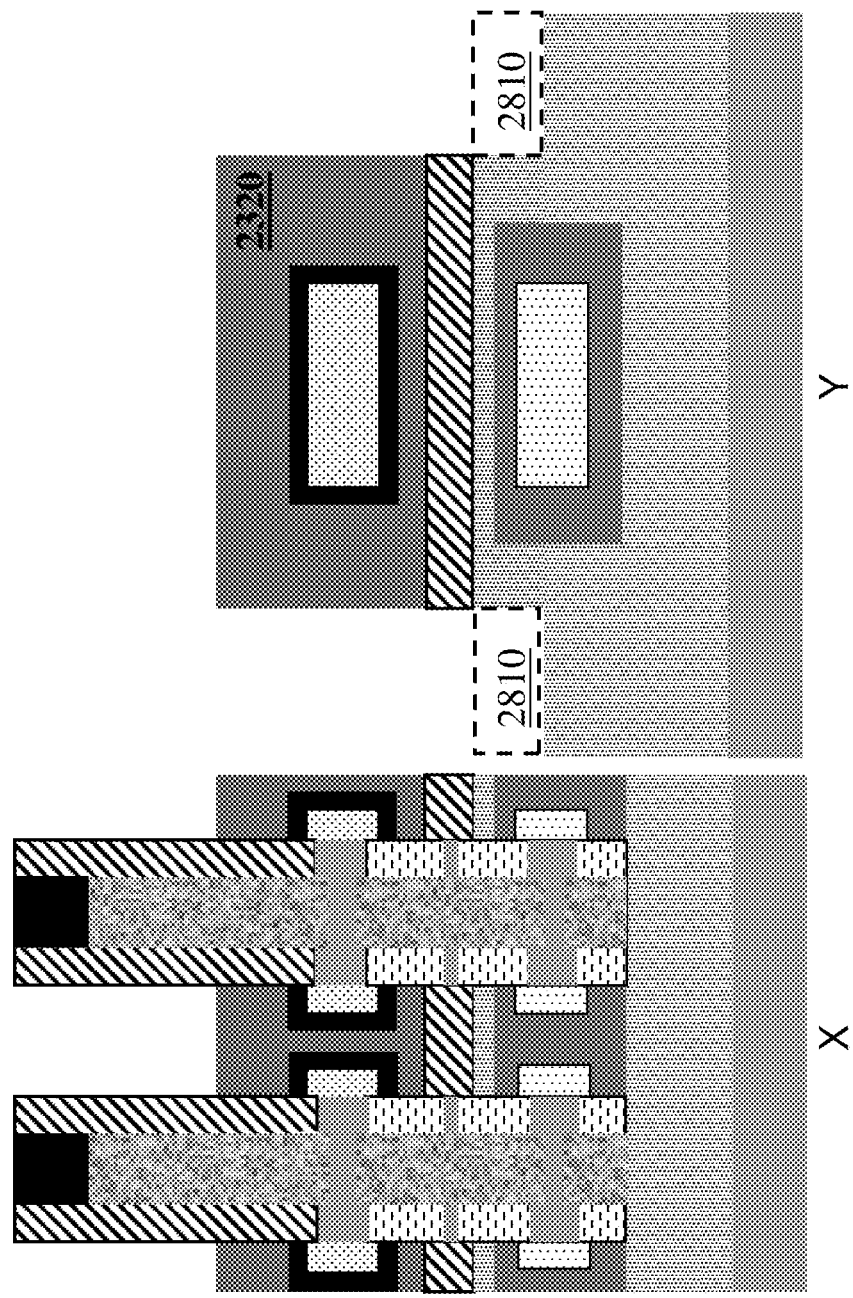
FIG. 27 depicts removal of the dielectric layer and partial removal of the isolation layer.

FIG. 27 illustrates removing dielectric layer 2510 as well as removing a top portion 2810 (shown in phantom via dotted lines) of isolation layer 2020 not underneath second SiGe material 2320. The noted removal can be performed by an etching technique, for instance directional (anisotropic) etching.

Figure 28:
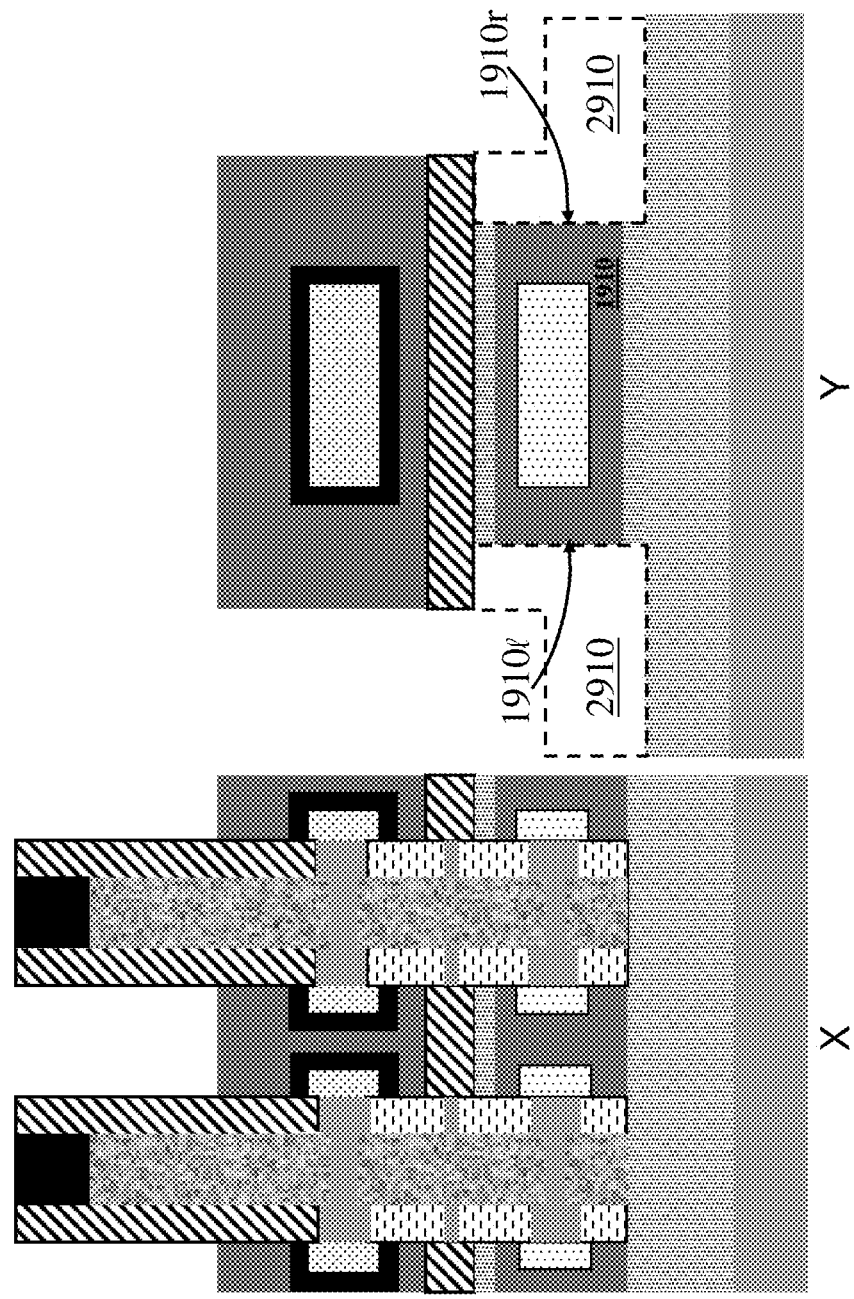
FIG. 28 depicts etching the isolation layer.

FIG. 28 illustrates isotropic etching of portions 2910 of isolation layer 2020. The noted etching is performed such that vertical edges 1910l, 1910r of first SiGe material 1910 are exposed.

Figure 29:
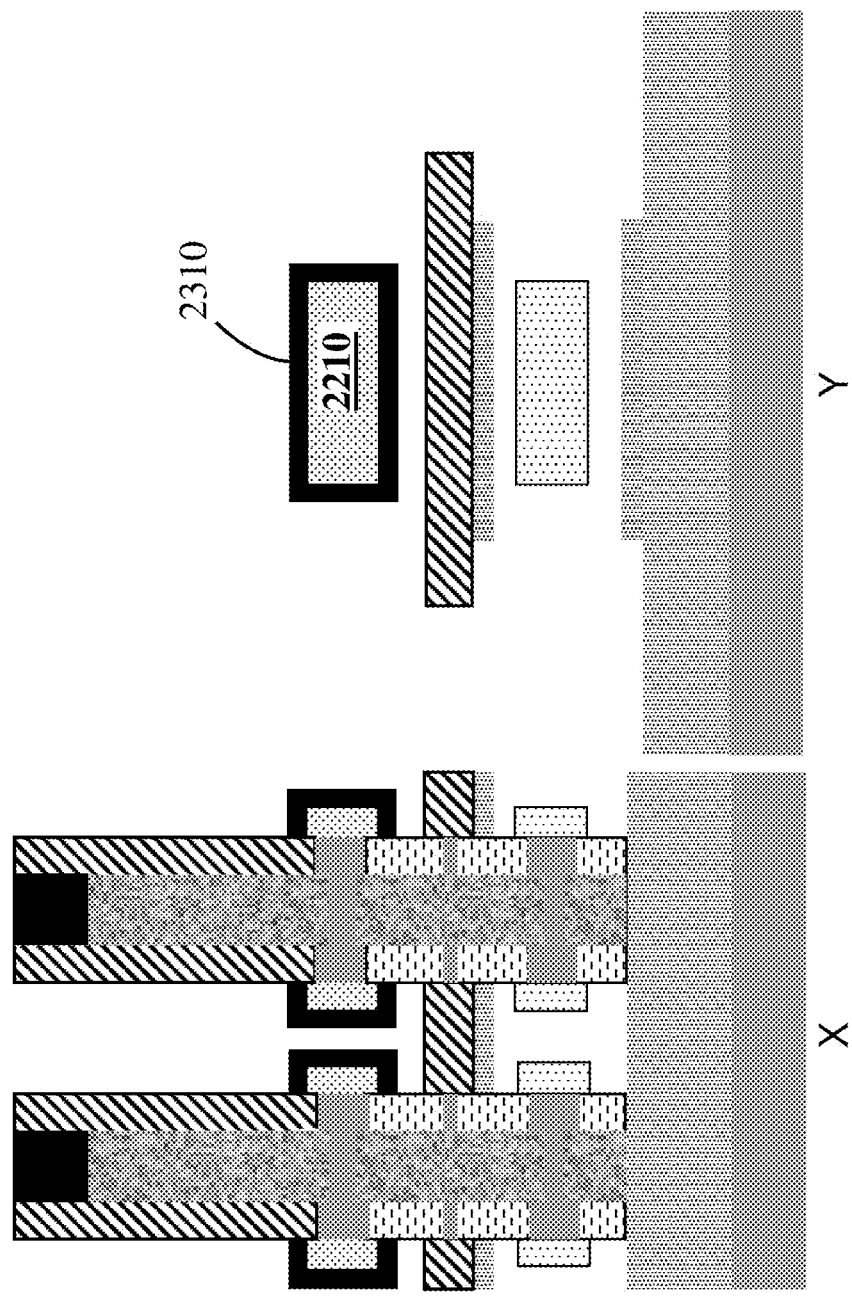
FIG. 29 depicts removal of the first different epitaxy growth and the second different epitaxy growth.

FIG. 29 illustrates selective removal of first and second SiGe materials 1910, 2320 (referring back to FIG. 28). The noted removal may be performed by any known or above-discussed removed technique such as, but not limited to, etching. It is noted here that conformal Si layer 2310 on second doped material 2210 acts as an etch stop during etching.

Figure 30:
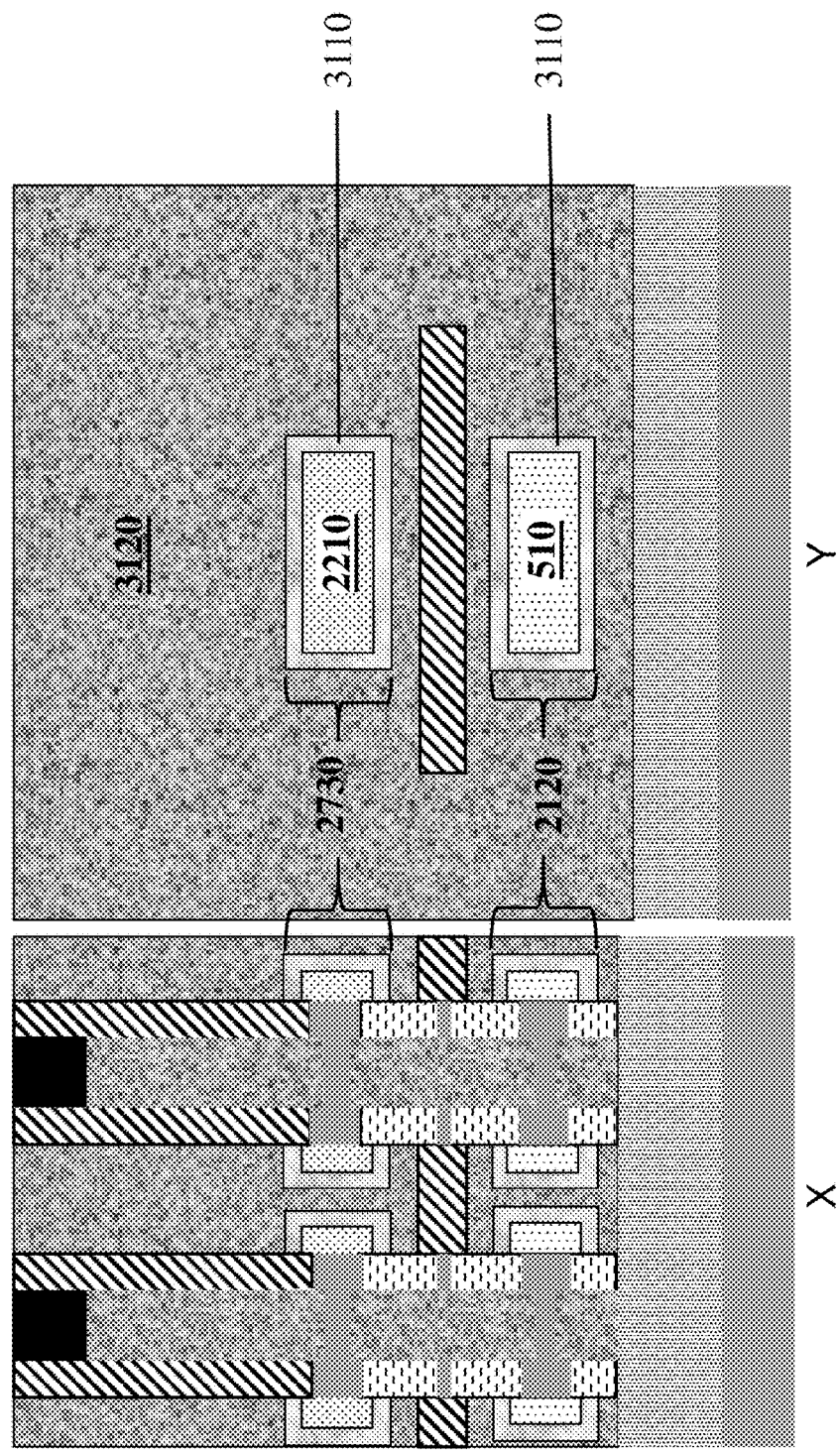
FIG. 30 depicts conformal silicide layer formation and metal overfilling of the structure.

FIG. 30 illustrates forming a conformal silicide layer 3110 on first doped material 510 and second doped material 2210. The conformal silicide layer 3110 on first doped material 510 is formed by performing a silicidation process on exposed surfaces of first doped material 510, whereas conformal silicide layer 3110 on second doped material 2210 is formed by performing a silicidation process on conformal Si layer 2310 present on second doped material 2210.

As noted above, the compilation of FIG. 27 through FIG. 30 illustrates formation of a wrap-around contact using a conformal metal fill 3120 that encompasses both first and second FETs 2120, 2730. In order to provide electrical conductivity separation between first FET 2120 and second FET 2730, first and second isolation pillars are formed as described below with respect to FIG. 31 through FIG. 34. The metal of conformal metal fill 3120 can be any conductive metal and can be the same or different from that of the metal of HKMG 2710 described above.

Figure 31:
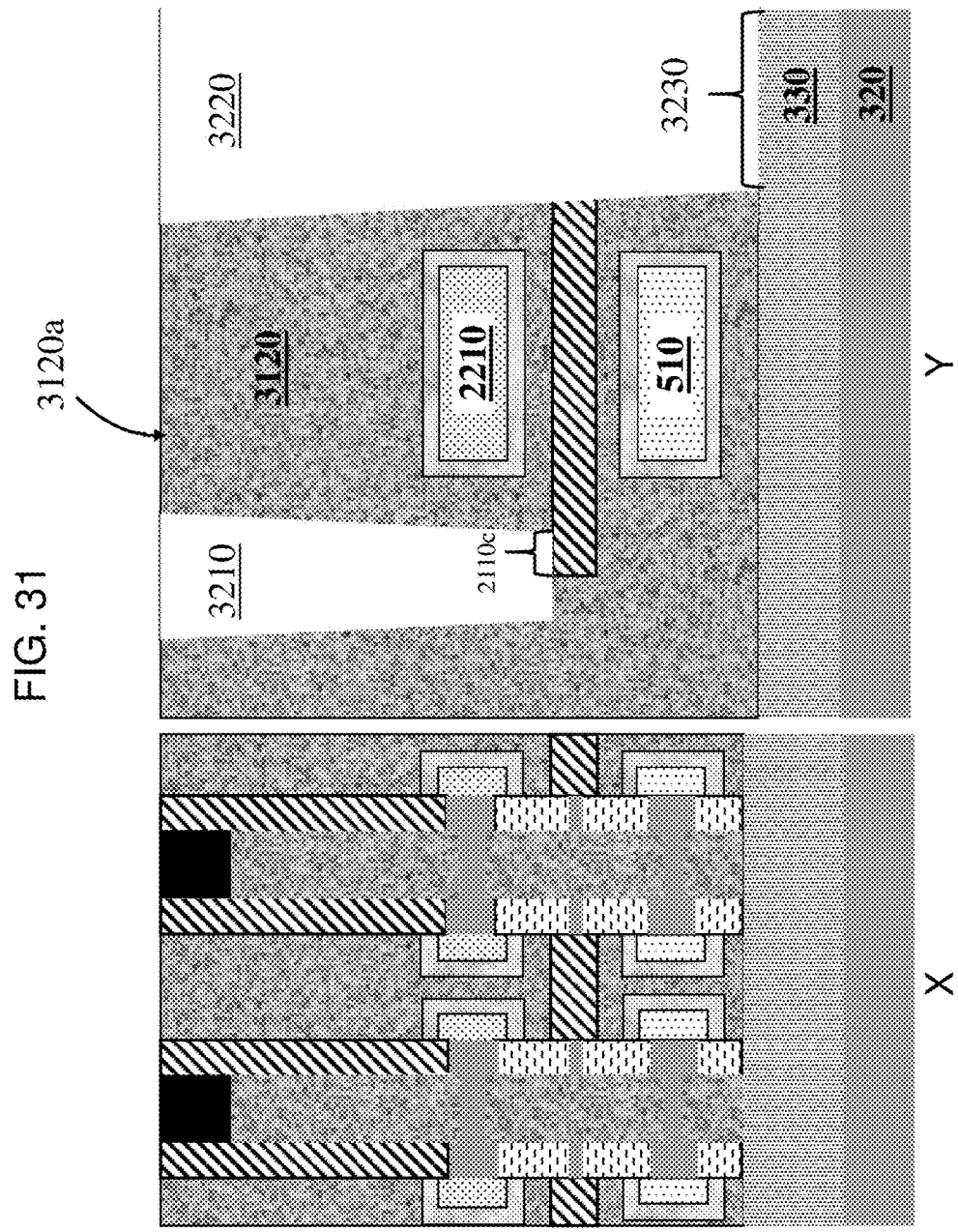
FIG. 31 depicts, in one embodiment, formation of first and second vertical openings.

FIG. 31 illustrates forming a first vertical opening 3210 and a second vertical opening 3220. First vertical opening 3210 extends from a top surface 3120a of conformal metal 3120 to a portion 2110c of the top surface of spacer layer 2110. Portion 2110c of spacer layer 2110 is not located underneath second doped material 2210. Second vertical opening 3220 extends from top surface 3120a of conformal metal 3120 to a portion 3230 of the top surface of substrate 320 or, in the presence of insulating layer 330, the top surface of insulating layer 330. Portion 3230 is not located underneath first and second doped material 510, 2210. First and second vertical openings 3210, 3220 can be formed by an etching technique, for instance directional (anisotropic) etching. First and second vertical openings 3210, 3220 do not merge and/or intersect.

Figure 32:
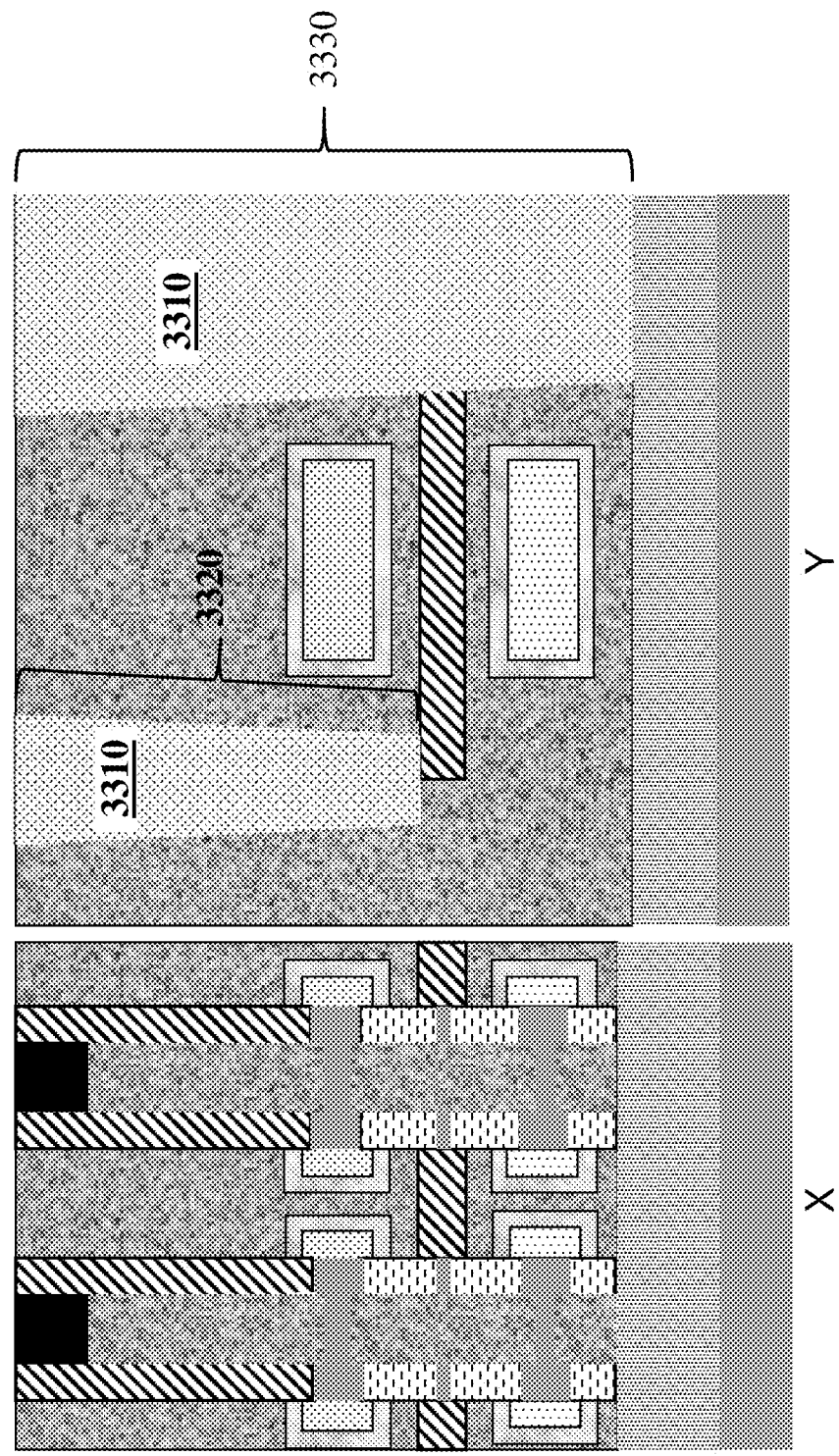
FIG. 32 depicts filling of the first and second vertical openings in the embodiment of FIG. 31.

FIG. 32 illustrates filling first and second vertical openings 3210, 3220 with a dielectric material 3310. Dielectric material 3310 can be any dielectric material including, but not limited to, oxides such and $SiO_2$ and nitrides such as SiN. Dielectric material 3310 can be deposited by any known deposition technique. The noted filling of first and second vertical openings 3210, 3220 with dielectric material 3310 forms a first isolation pillar 3320 and a second isolation pillar 3330 respectively.

Figure 33:
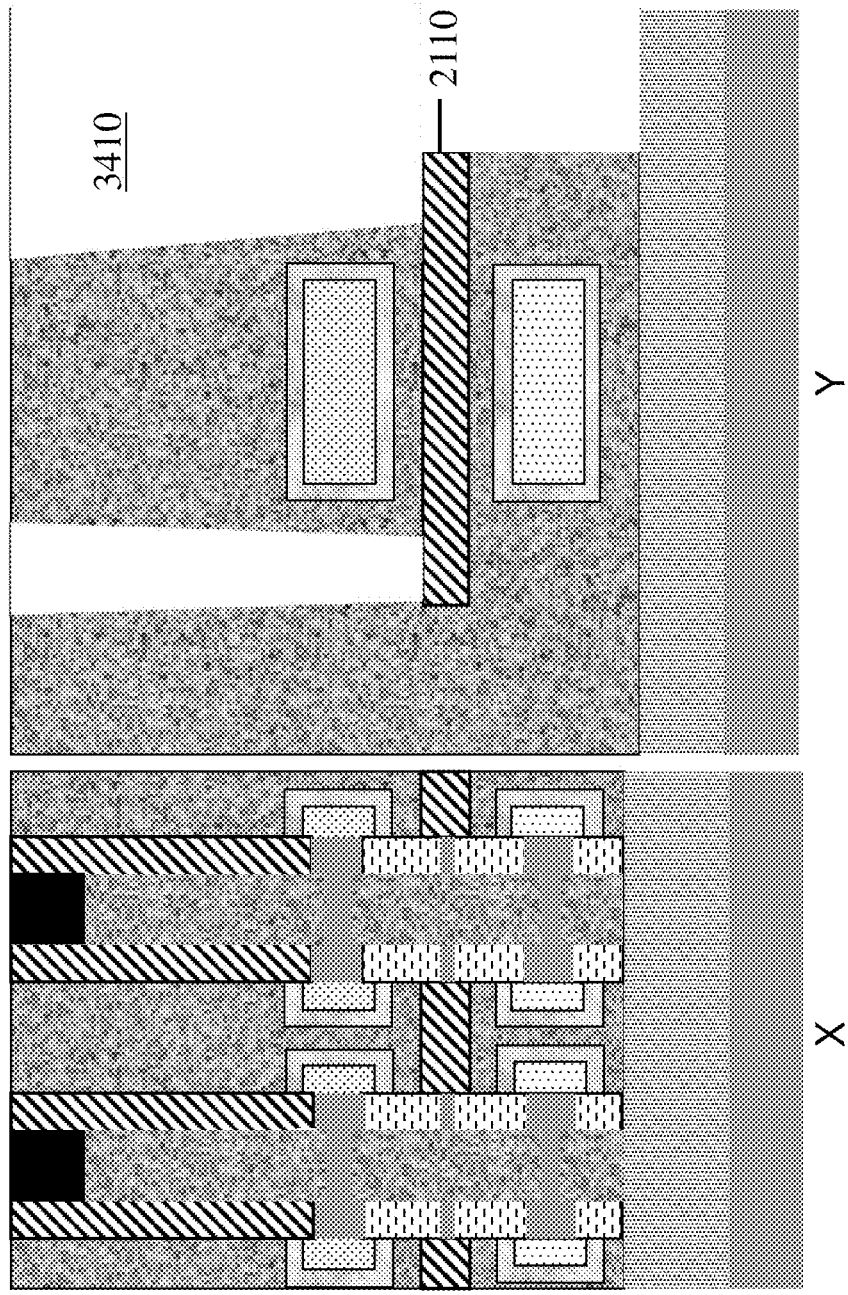
FIG. 33 depicts, in another embodiment, formation of first and second vertical openings.

FIG. 33 is a variation of FIG. 31 wherein second vertical opening 3410 has a different configuration than that of second vertical opening 3220 of FIG. 31. Vertical opening 3410 of FIG. 33 does not pass through spacer layer 2110 like it does in vertical opening 3220 of FIG. 31. Such a difference is due to different opening techniques with different materials selectivity.

Figure 34:
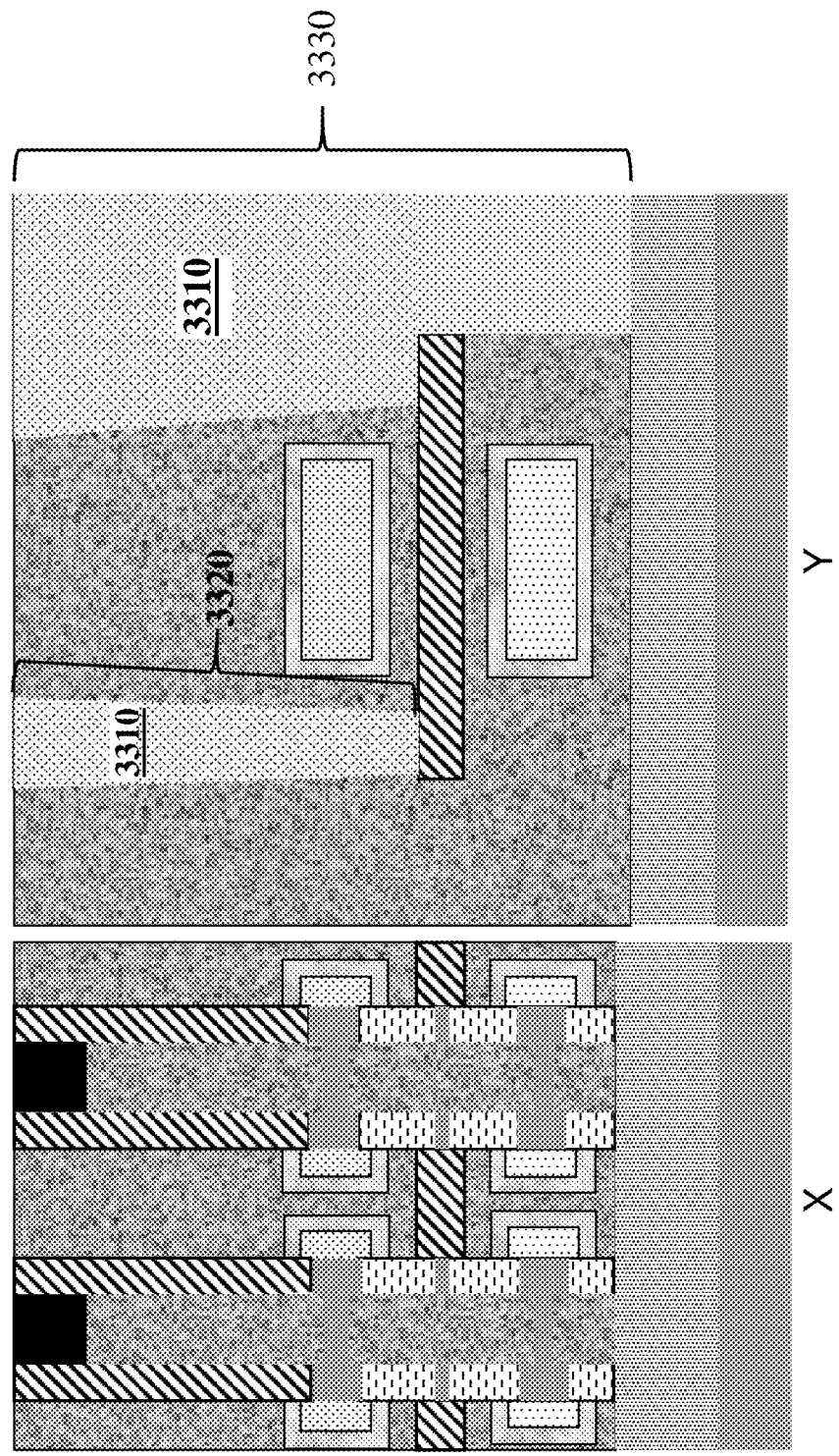
FIG. 34 depicts filling of the first and second vertical openings in the embodiment of FIG. 33.

FIG. 34 is a variation of FIG. 32 wherein the different configuration of second vertical opening 3410 has been filled with dielectric material 3310.

Regardless of the configuration of second vertical opening 3210/3410, first and second isolation pillars 3320, 3330 provide electrical isolation of first FET 2120 from second FET 2730.

Considering both the first embodiment (e.g., FIG. 2-FIG. 17) and the second embodiment (e.g., FIG. 18-FIG. 34) as described above, the present disclosure provides methods of forming CFETs and the resulting CFETs with wrap around contacts for use in a semiconductor device that maintain vertical integration and electrical disconnection of vertically stacked FETs, i.e., electrical disconnection of nFET and pFET source/drain Epitaxies.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:
1. A method of forming a stacked integrated circuit structure comprising:
    forming a first FET on a substrate, the first FET including at least one first gate, at least one first source and at least one first drain;
    forming a spacer layer over the first source and the first drain of the first FET;
    forming a second FET over the spacer layer, the second FET being vertically stacked above the first FET, the second FET including at least one second gate, at least one second source and at least one second drain, the first and second gates being vertically aligned, and at least a portion of the second source and at least a portion of the second drain being above and vertically aligned with at least a portion of the first source and at least a portion of the first drain, respectively;
    forming a dielectric layer over the second FET;
    forming a first lateral conductive metal region and a first vertical conductive metal region, the first lateral conductive metal region surrounding at least one of the first source and the first drain of the first FET and extending laterally outward beyond any portion of the second FET thereabove, the first vertical conductive metal region extending upwards from the first lateral conductive metal region to a top surface of the dielectric layer; and
    forming a second vertical conductive metal region, the second vertical conductive metal region surrounding at least one of the second source and the second drain of the second FET and extending upwards to the top surface of the dielectric layer, the second vertical conductive metal region not intersecting the first vertical conductive metal region.

2. The method of claim 1, wherein the forming of the first FET and the spacer layer over the first FET comprises:
    epitaxially growing a nanosheet stack of alternating layers of silicon-germanium (SiGe) and silicon, a bottom-most layer of the nanosheet stack being SiGe and a top-most layer of the nanosheet stack being Si;
    forming at least one dummy gate on a portion of the top-most layer of the nanosheet stack, the dummy gate being protected by a hardmask on a top surface thereof;
    forming gate spacers on sidewalls of the dummy gate and sidewalls of the hardmask;
    etching the nanosheet stack layers such that portions of the nanosheet stack layers not underneath the gate spacers and the dummy gate are removed;
    selectively etching the SiGe layers of the nanosheet stack such that portions of the SiGe layers underneath the gate spacers are removed;
    forming inner spacers in the etched portions of the SiGe layers, the inner spacers being located under the gate spacers;
    epitaxially growing a first doped material on vertical edges of the Si layers of the nanosheet stack;
    encapsulating the first doped material with a first SiGe material that has a lower percentage of Ge than the SiGe layers of the nanosheet stack and overfilling such that a top surface of the first SiGe material is above a top surface of the gate spacers and a top surface of the hardmask;
    etching the first SiGe material and the first doped material such that all of the first SiGe material and all of the first doped material is removed above a level that is vertically located between two Si layers of the nanosheet stack; and forming the spacer layer on a top surface of the etched first SiGe material.

3. The method of claim 2, wherein the forming of the second FET and the dielectric layer over the second FET comprises:
- epitaxially growing a second doped material on vertical edges of one or more Si layers of the nanosheet stack located above the spacer layer;
- epitaxially growing a conformal Si layer on surfaces of the second doped material;
- epitaxially growing a second SiGe material that has a lower percentage of Ge than the SiGe layers of the nanosheet stack on surfaces of the conformal Si layer such that a top surface of the second SiGe material is below the hardmask and a bottom surface of the second SiGe material is on a portion of the top surface of the spacer layer;
- forming a dielectric layer over the second SiGe material, exposed portions of the spacer layer, the gate spacers and the hardmask;
- planarizing the dielectric layer such that a top surface of the dielectric layer is approximately coplanar with a top surface of the dummy gate;
- removing the dummy gate and the SiGe layers of the nanosheet stack; and
- forming a high-k metal gate (HKMG) in place of the removed dummy gate and removed SiGe layers of the nanosheet stack, and forming a cap over a top surface of the HKMG.

4. The method of claim 3, wherein the forming of the first lateral and vertical conductive metal regions comprises:
- forming a first vertical contact opening from the top surface of the dielectric layer, through the dielectric layer, through the spacer layer and to the top surface of the first SiGe material;
- selectively removing the first SiGe material, thereby forming a lateral contact opening;
- forming a conformal silicide layer on the first doped material by performing a silicidation process on exposed surfaces of the first doped material;
- forming a conformal liner on walls of the first vertical contact opening, a bottom surface of the spacer layer, a top surface of the substrate and surfaces of the conformal silicide layer; and
- filling open spaces of the first vertical contact opening and the lateral contact opening with a conductive metal, thereby forming the first vertical conductive metal region and the first lateral conductive metal region respectively.

5. The method of claim 4, wherein the forming of the second vertical conductive metal region comprises:
- forming a second vertical contact opening from the top surface of the dielectric layer, through a portion of the dielectric layer, around the second doped material having the conformal Si layer thereon and to a top surface of the second SiGe material;
- selectively removing the second SiGe material;
- forming a conformal silicide layer on the second doped material by performing a silicidation process on the conformal Si layer thereon;
- forming a conformal liner on walls of the second vertical contact opening and the conformal silicide layer; and
- filling open spaces of the second vertical contact opening with a conductive metal, thereby forming the second vertical conductive metal region.

6. The method of claim 1, wherein the first FET is of a first polarity type and the second FET is of a second polarity type opposite that of the first polarity type.

* * * * *